(12) United States Patent
Kariya et al.

(10) Patent No.: US 7,894,203 B2
(45) Date of Patent: Feb. 22, 2011

(54) MULTILAYER PRINTED WIRING BOARD

(75) Inventors: Takashi Kariya, Gifu (JP); Akiyoshi Tsuda, Gifu (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 432 days.

(21) Appl. No.: 10/546,620

(22) PCT Filed: Feb. 5, 2004

(86) PCT No.: PCT/JP2004/001233

§ 371 (c)(1), (2), (4) Date: Aug. 23, 2005

(87) PCT Pub. No.: WO2004/077560

PCT Pub. Date: Sep. 10, 2004

(65) Prior Publication Data

US 2006/0237225 A1     Oct. 26, 2006

(30) Foreign Application Priority Data

Feb. 26, 2003    (JP)    ............................. 2003-049252
Feb. 26, 2003    (JP)    ............................. 2003-049253

(51) Int. Cl.
*H05K 7/10*    (2006.01)
*H05K 7/12*    (2006.01)

(52) U.S. Cl. ....................... 361/768; 361/763; 361/792; 361/795

(58) Field of Classification Search ......... 361/767–754; 174/259–261; 257/728–730
See application file for complete search history.

(56) References Cited

U.S. PATENT DOCUMENTS

| | | | | |
|---|---|---|---|---|
| 5,374,469 A | | 12/1994 | Hino et al. | |
| 5,468,999 A | * | 11/1995 | Lin et al. | 257/784 |
| 5,541,450 A | * | 7/1996 | Jones et al. | 257/697 |
| 5,963,430 A | * | 10/1999 | Londa | 361/790 |
| 6,005,289 A | | 12/1999 | Watanabe et al. | |
| 6,014,318 A | * | 1/2000 | Takeda | 361/764 |
| 6,037,656 A | * | 3/2000 | Sugahara | 257/697 |
| 6,324,067 B1 | * | 11/2001 | Nishiyama | 361/761 |
| 6,469,374 B1 | | 10/2002 | Imoto | |

(Continued)

FOREIGN PATENT DOCUMENTS

EP     0 921 569 A1    6/1999

(Continued)

*Primary Examiner*—Tuan T Dinh
(74) *Attorney, Agent, or Firm*—Oblon, Spivak, McClelland, Maier & Neustadt, L.L.P.

(57) ABSTRACT

A multi-layer printed wiring board including a first substrate having an opening and having external terminals positioned to be connected to a package substrate, a second substrate laminated to the first substrate and having external terminals positioned to be connected to a mother board, the second substrate having a metallic layer portion in the opening of the first substrate and non-through holes filled with conductive material and connected to the metallic layer portion, and an IC component having terminals and loaded in the opening of the first substrate such that the terminals of the IC component face an opposite side of the metallic layer portion of the second substrate. The IC chip is accommodated in the opening such that the metallic layer portion and non-through holes of the second substrate irradiate heat generated by the IC chip.

11 Claims, 24 Drawing Sheets

U.S. PATENT DOCUMENTS

| | | | |
|---|---|---|---|
| 6,534,723 B1 * | 3/2003 | Asai et al. | 174/255 |
| 6,687,985 B2 * | 2/2004 | Sakamoto et al. | 29/830 |
| 6,828,510 B1 * | 12/2004 | Asai et al. | 174/255 |
| 6,970,362 B1 * | 11/2005 | Chakravorty | 361/782 |
| 7,525,813 B2 * | 4/2009 | Kohjiro et al. | 361/760 |

FOREIGN PATENT DOCUMENTS

| | | |
|---|---|---|
| EP | 1 282 343 A1 | 2/2003 |
| JP | 63-047961 | 2/1988 |
| JP | 63-234552 | 9/1988 |
| JP | 7-226456 A | 8/1995 |
| JP | 07-263869 | 10/1995 |
| JP | 10-13028 A | 1/1998 |
| JP | 11-097583 | 4/1999 |
| JP | 11-168150 | 6/1999 |
| JP | 2000-077454 | 3/2000 |
| JP | 2000-332057 | 11/2000 |
| JP | 2001-015932 | 1/2001 |
| JP | 2001-102481 A | 4/2001 |
| JP | 2001-217550 A | 8/2001 |
| JP | 2001-230515 | 8/2001 |
| JP | 2001-319945 | 11/2001 |
| JP | 2001-332866 | 11/2001 |
| JP | 2002-43454 | 2/2002 |
| JP | 2002-100870 | 4/2002 |
| JP | 2002-164663 A | 6/2002 |
| JP | 2002-236229 | 8/2002 |
| JP | 2002-271025 | 9/2002 |
| JP | 2002-299775 | 10/2002 |
| JP | 2002-362937 | 12/2002 |
| WO | WO 94/25984 | 11/1994 |

* cited by examiner

Fig. 3
(A)
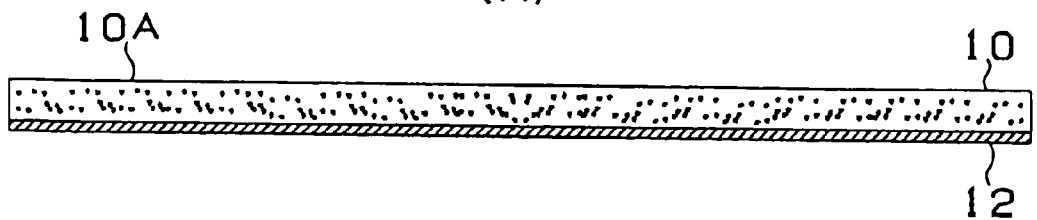
(B)
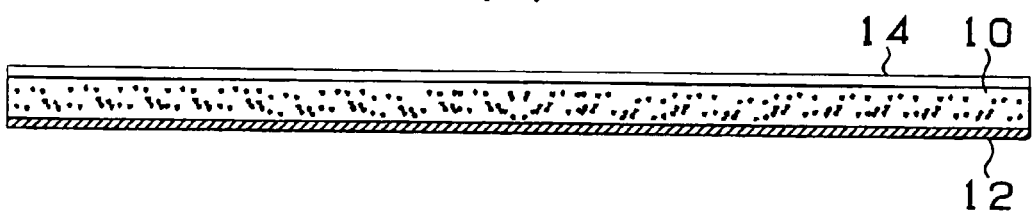
(C)
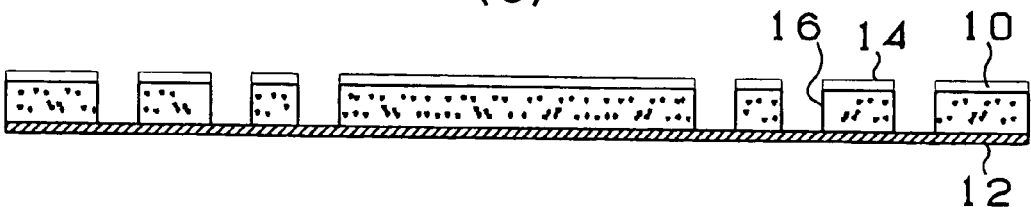
(D)
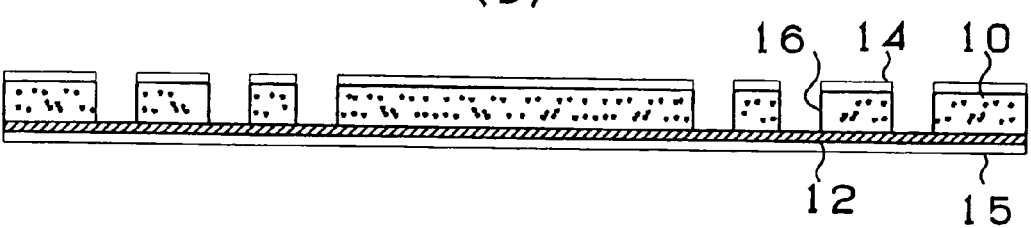
(E)
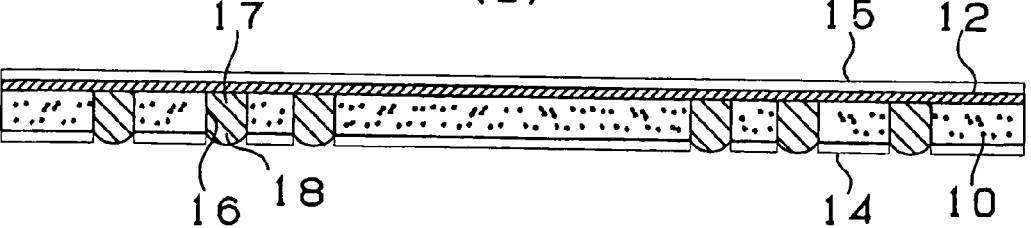

Fig. 4
(A)
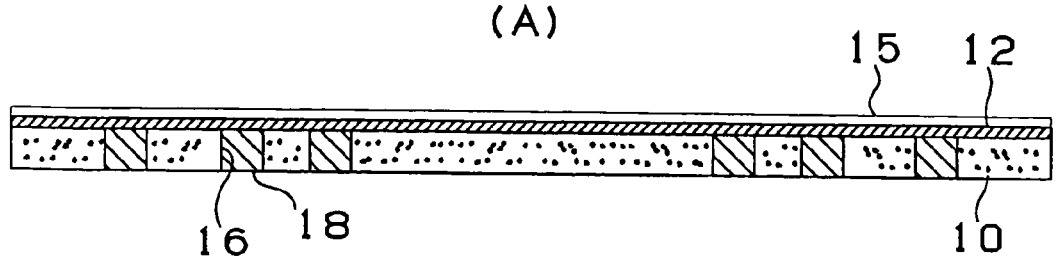
(B)
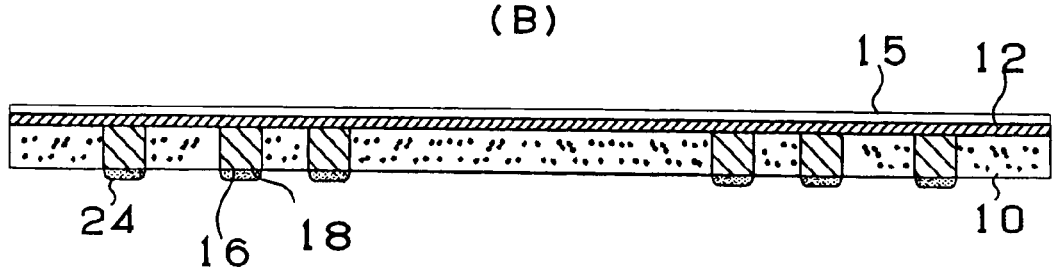
(C)
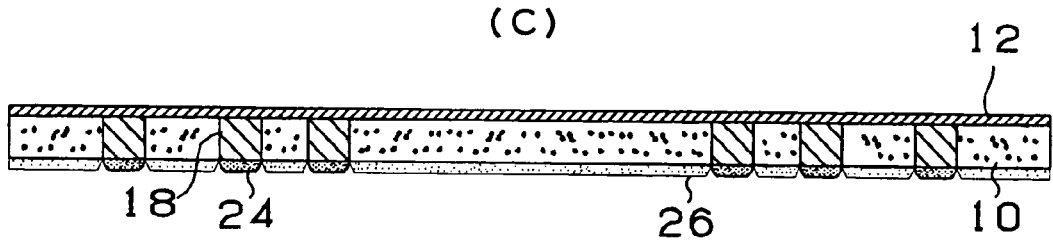
(D)
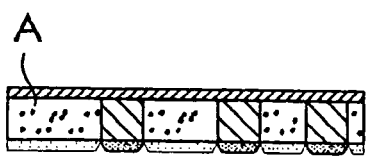

Fig. 5
(A)
(B)
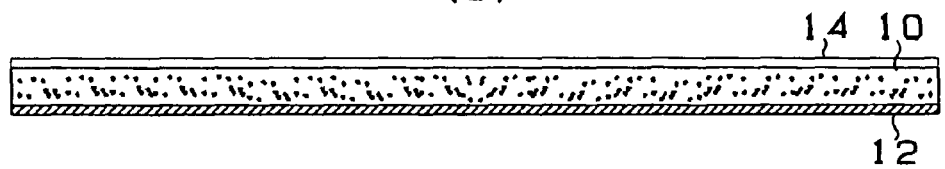
(C)
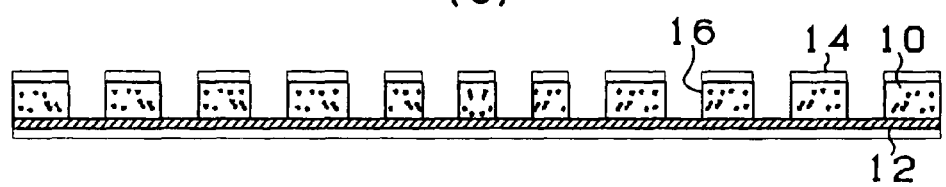
(D)
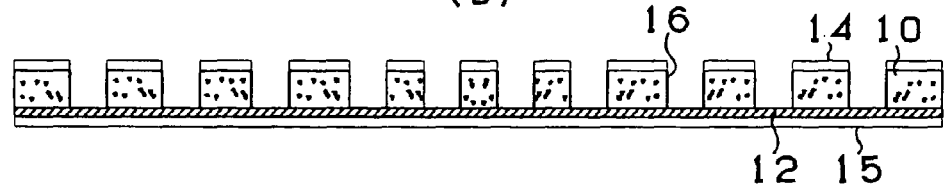
(E)
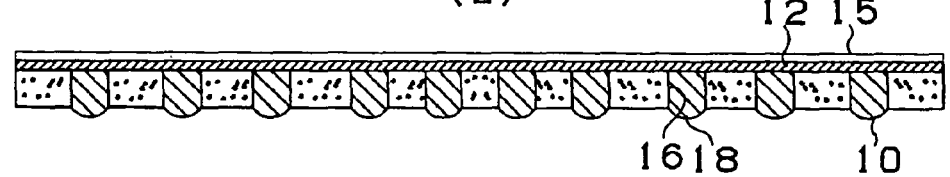
(F)
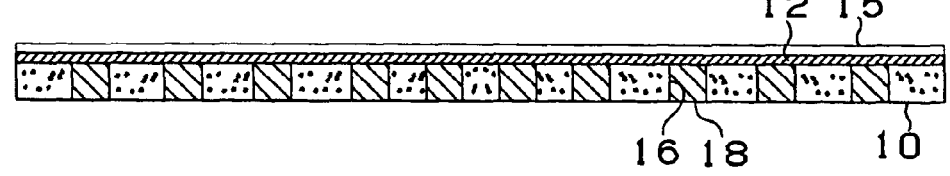
(G)
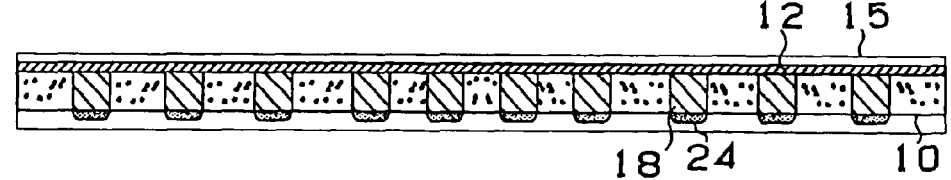

Fig. 6
(A)
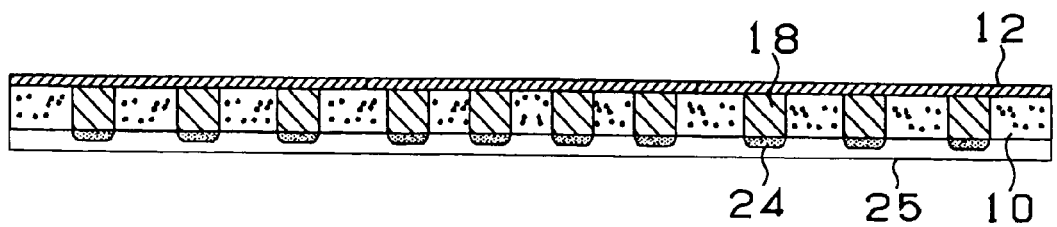
(B)
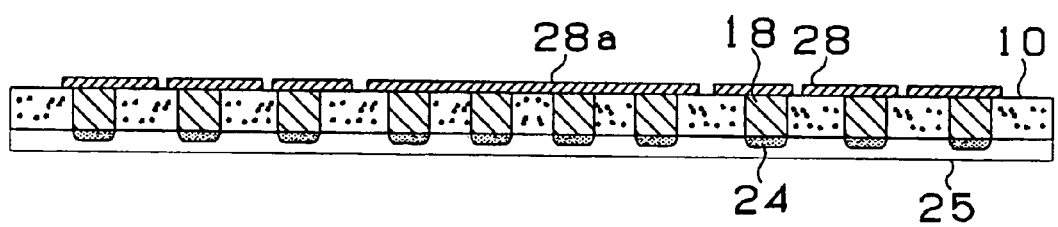
(C)
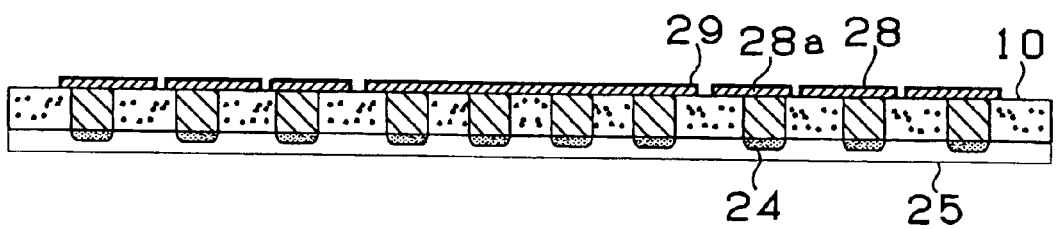
(D)
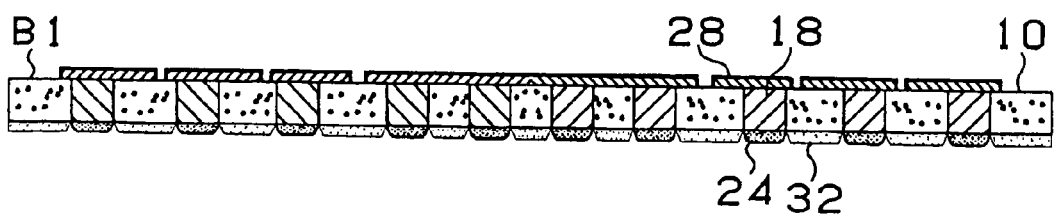

Fig. 7
(A)
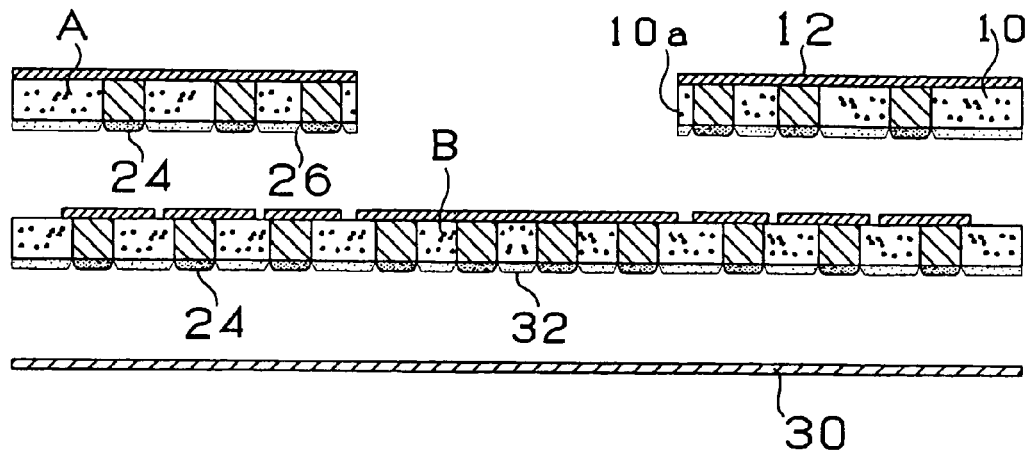
(B)
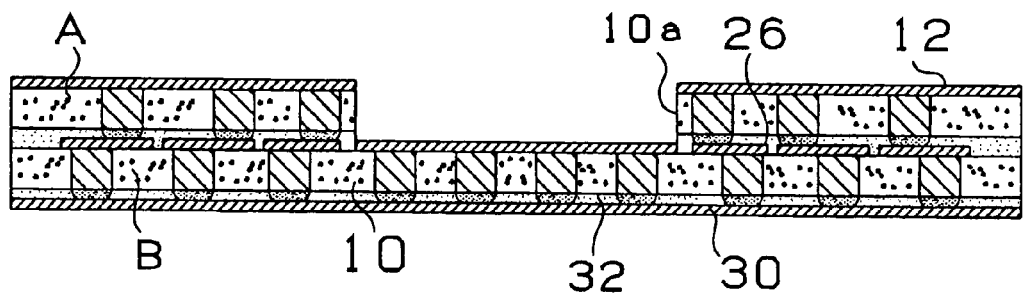
(C)
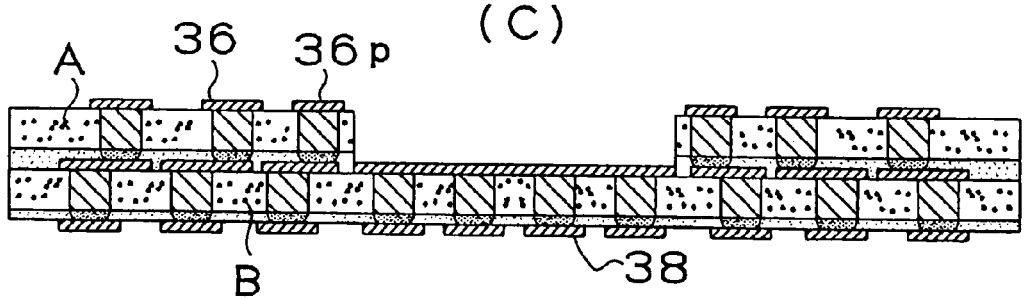

Fig. 8
(A)
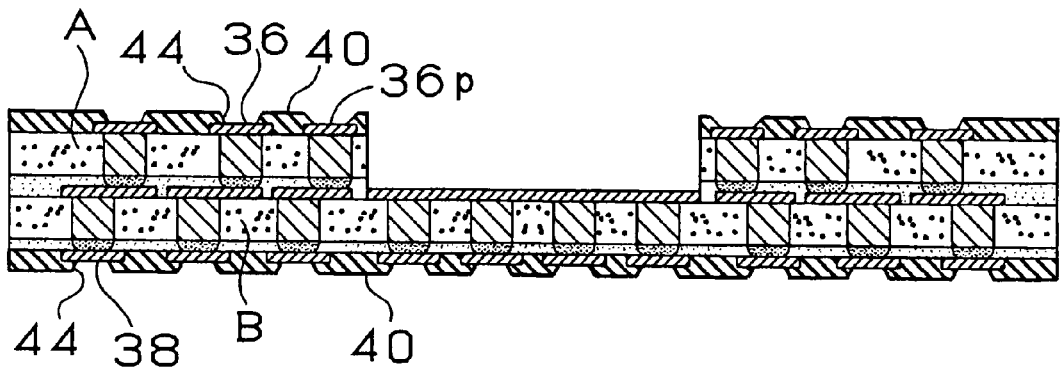
(B)
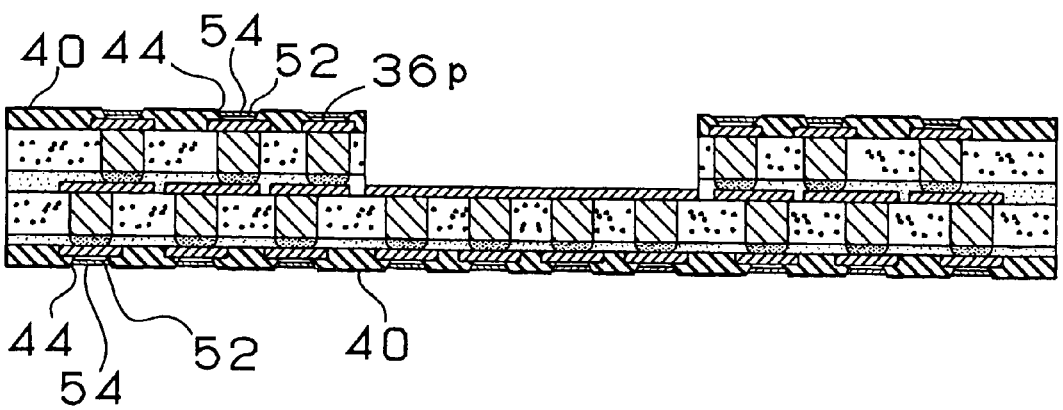

Fig. 9
(A)
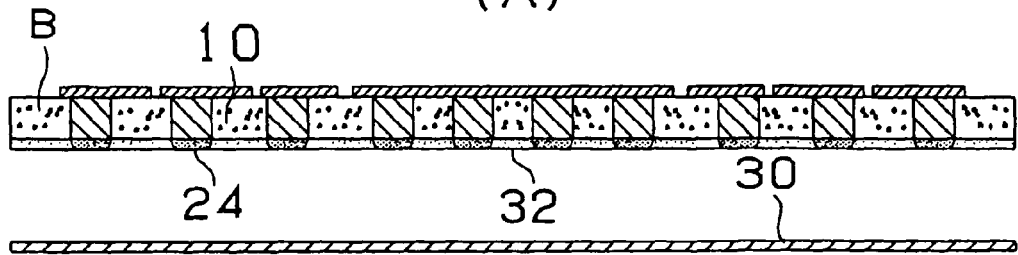
(B)
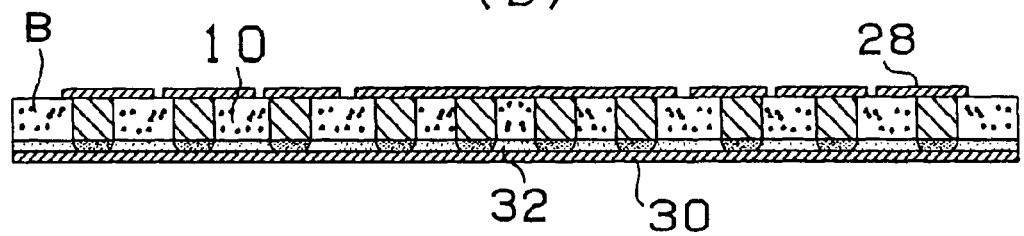
(C)
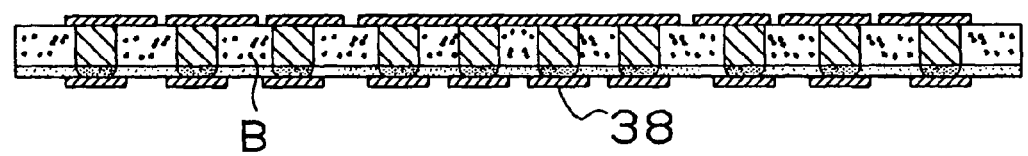
(D)
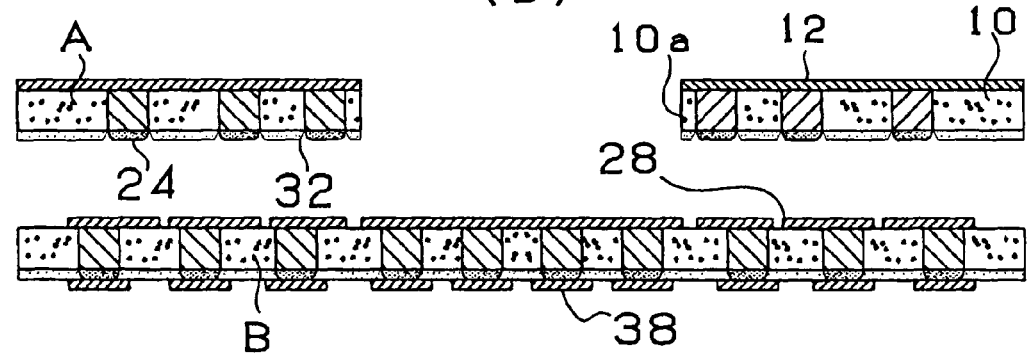
(E)
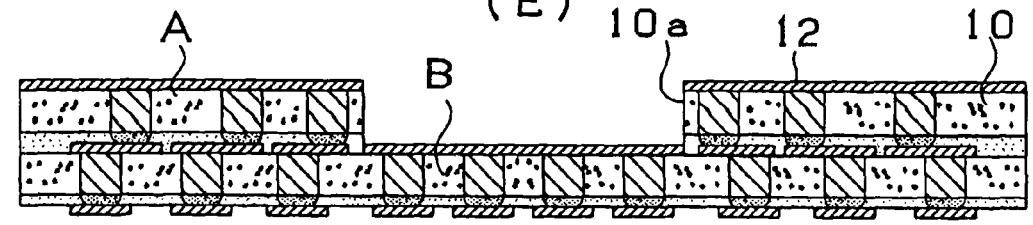

Fig. 10
(A)
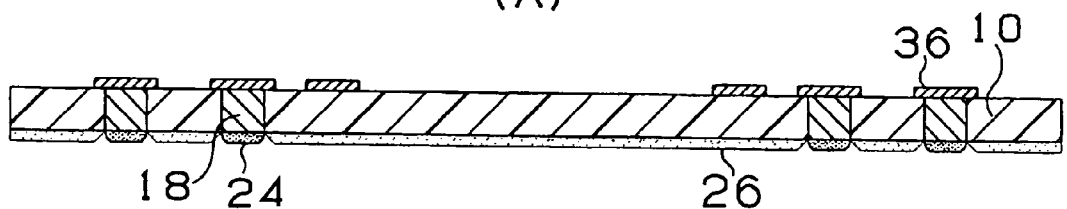
(B)
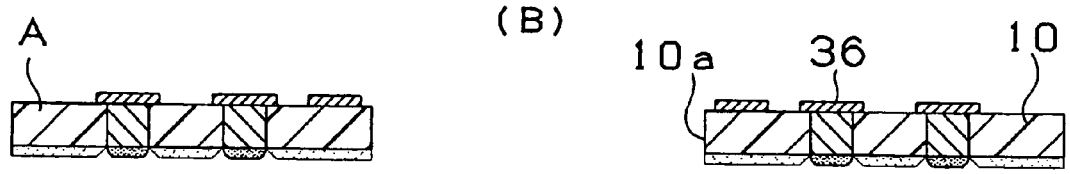
(C)
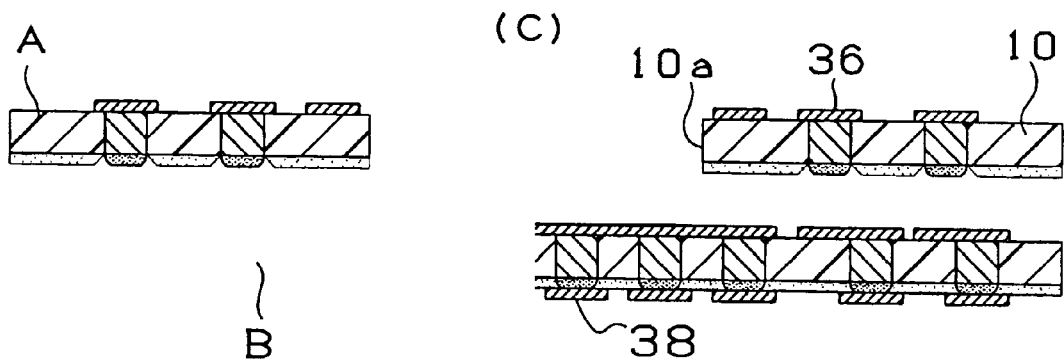
(D)
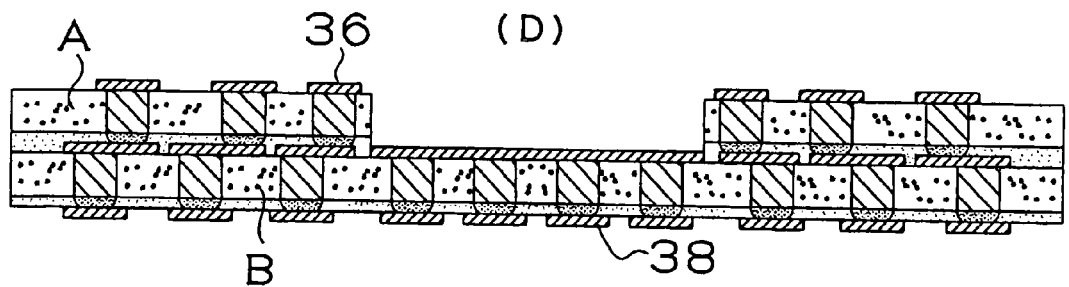

Fig. 11
(A)
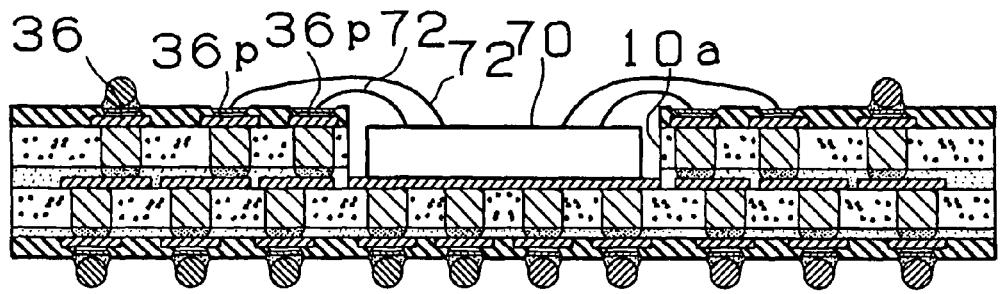
(B)
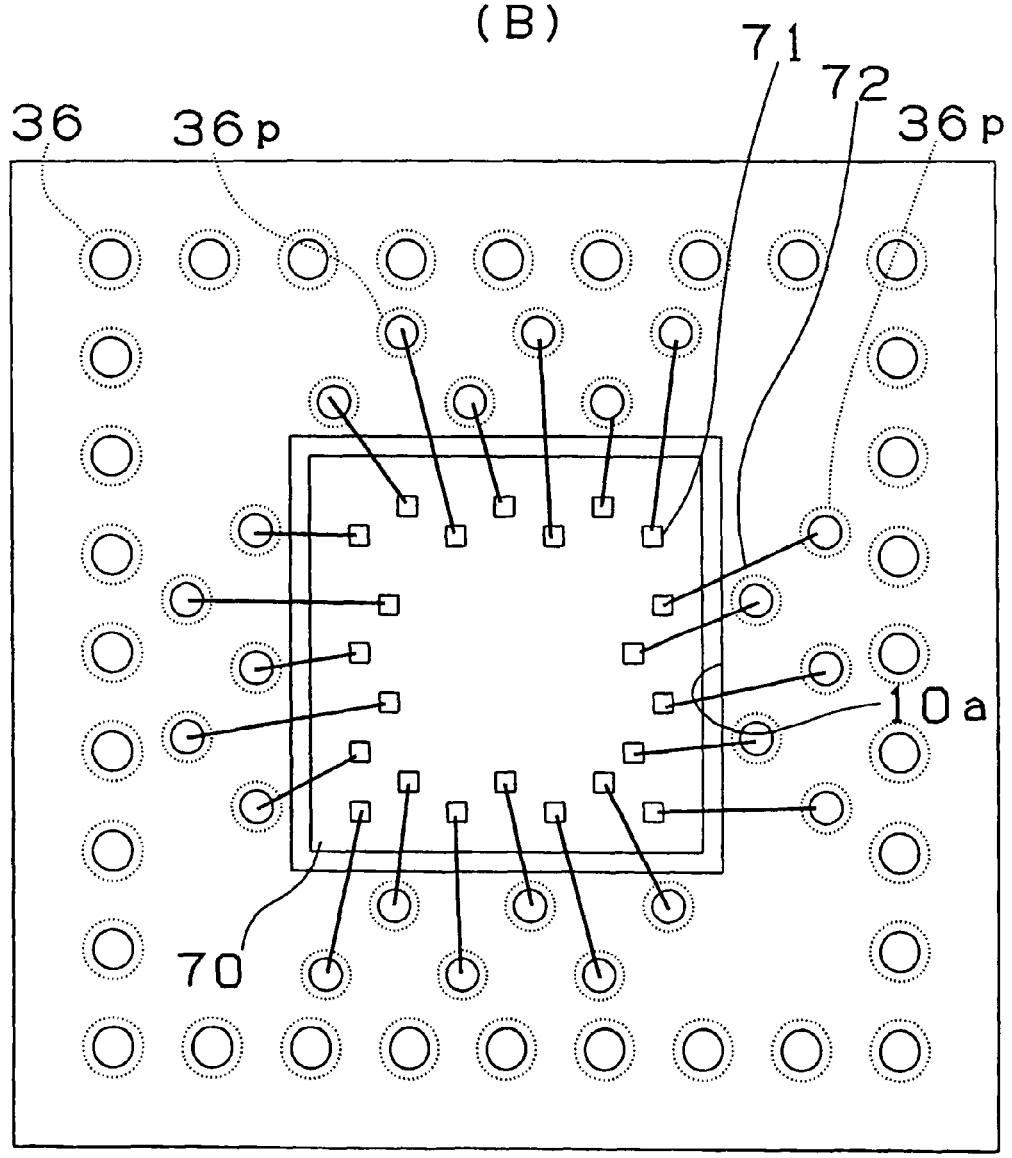

Fig. 14
(A)
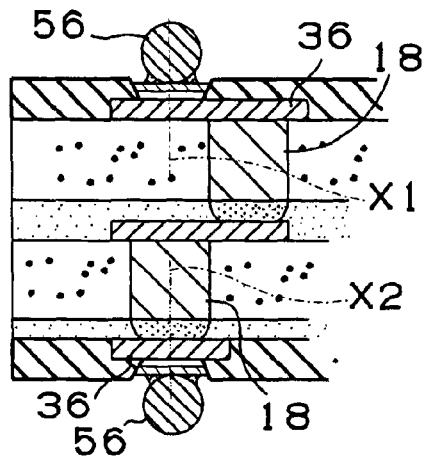
(B)
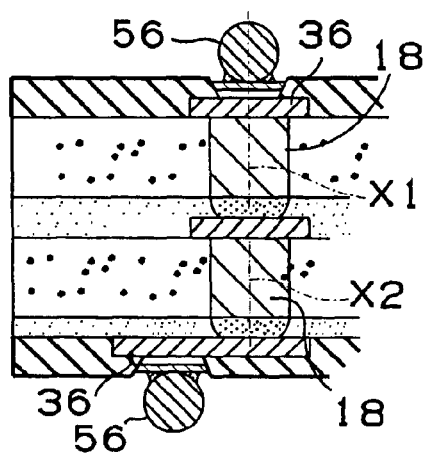
(C)
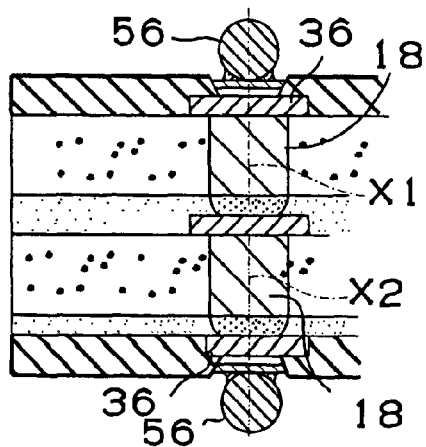

Fig. 15
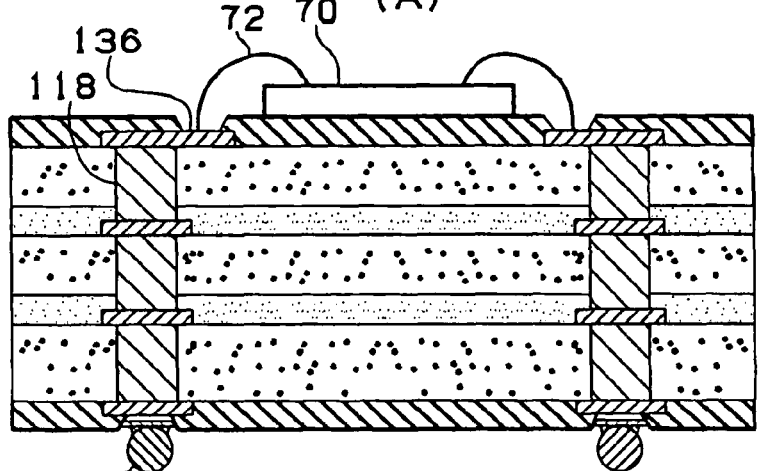
(A)
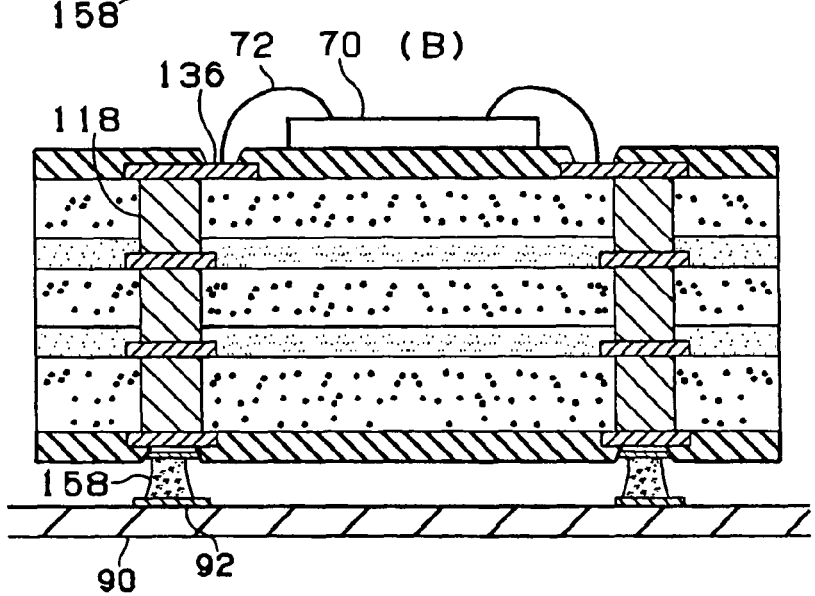
(B)
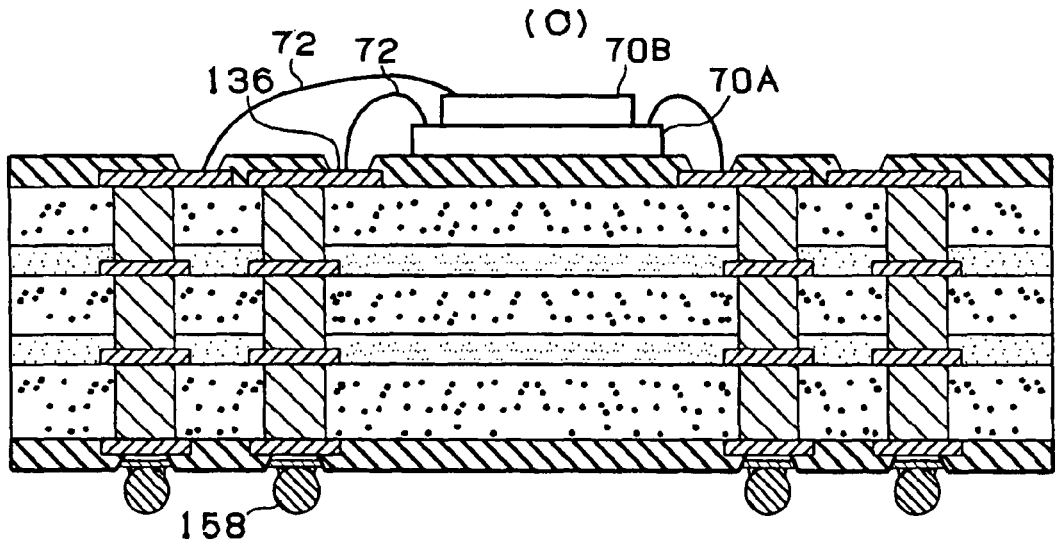
(C)

Fig. 16

| Classification | Inspection Possible/ Impossible | Repair Possible/ Impossible | 500 Cycle | 1000 Cycle | 2000 Cycle | 3000 Cycle |
|---|---|---|---|---|---|---|
| Example 1 | Possible | Possible | ○ | ○ | ○ | ○ |
| Modification 1 Of Example 1 | Possible | Possible | ○ | ○ | ○ | ○ |
| Modification 2 Of Example 1 | Possible | Possible | ○ | ○ | ○ | ○ |
| Modification 3 Of Example 1 | Possible | Possible | ○ | ○ | ○ | △ |
| Modification 4 Of Example 1 | Possible | Possible | ○ | ○ | ○ | △ |
| Change 1 Of Example 1 | Possible | Possible | ○ | ○ | ○ | △ |
| Change 2 Of Example 1 | Possible | Possible | ○ | ○ | ○ | △ |
| Change 3 Of Example 1 | Possible | Possible | ○ | ○ | △ | ▲ |
| Comparative Example 1 | − | Impossible | ○ | △ | × | × |
| Comparative Example 2 | − | Impossible | ○ | △ | ▲ | × |

○ : No Problem In Conduction Test On All Pieces
△ : Short-Circuit Occurrence In 1-2 Piece
▲ : Short-Circuit Occurrence In 3-4 Piece
× : Short-Circuit Occurrence In All Pieces

Fig. 17 (A) (B)

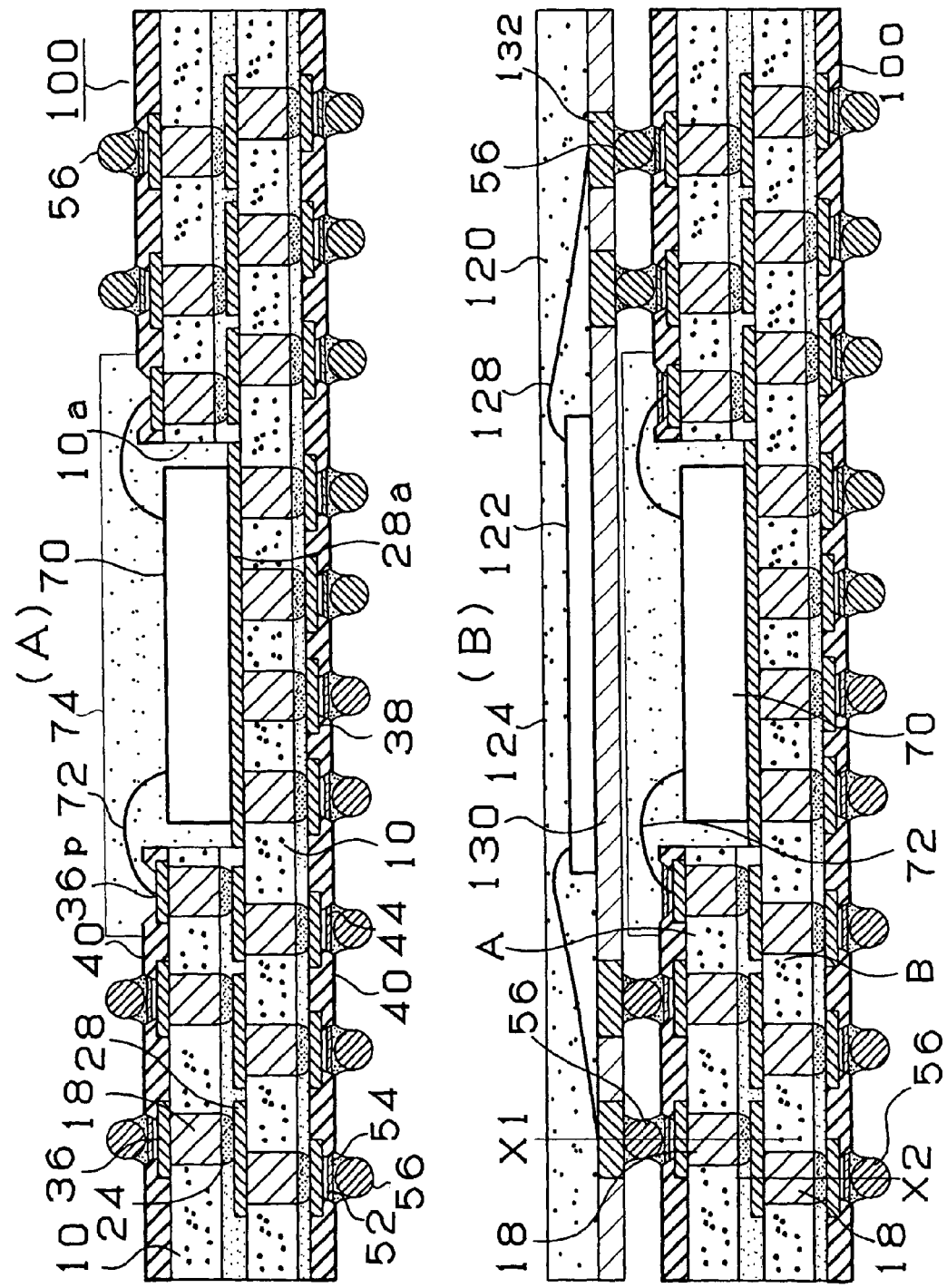

Fig. 19
(A)
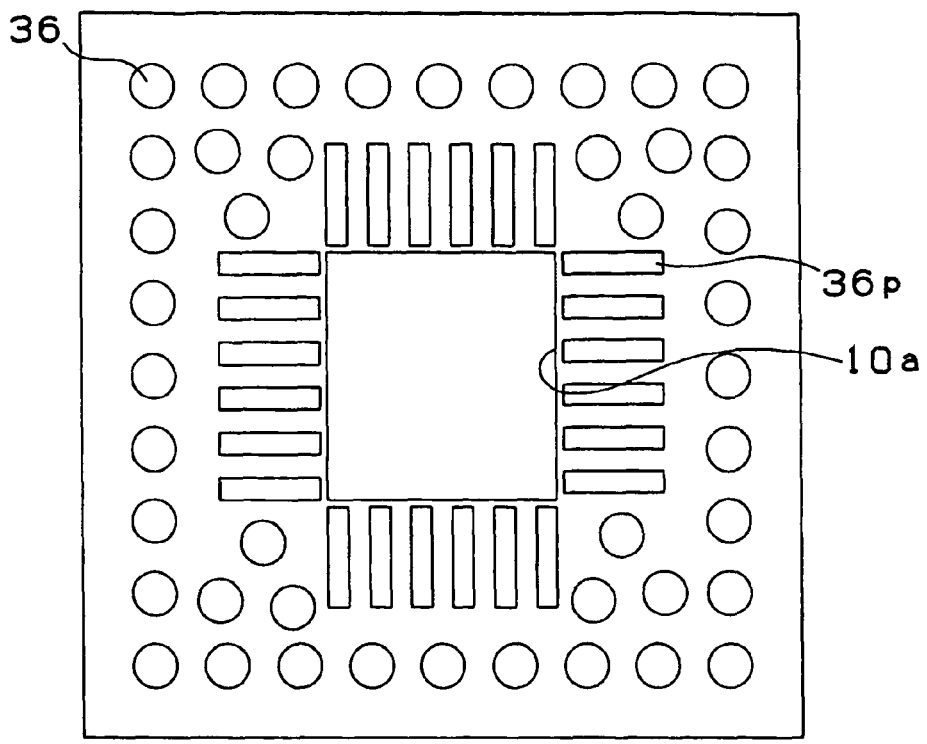
(B)
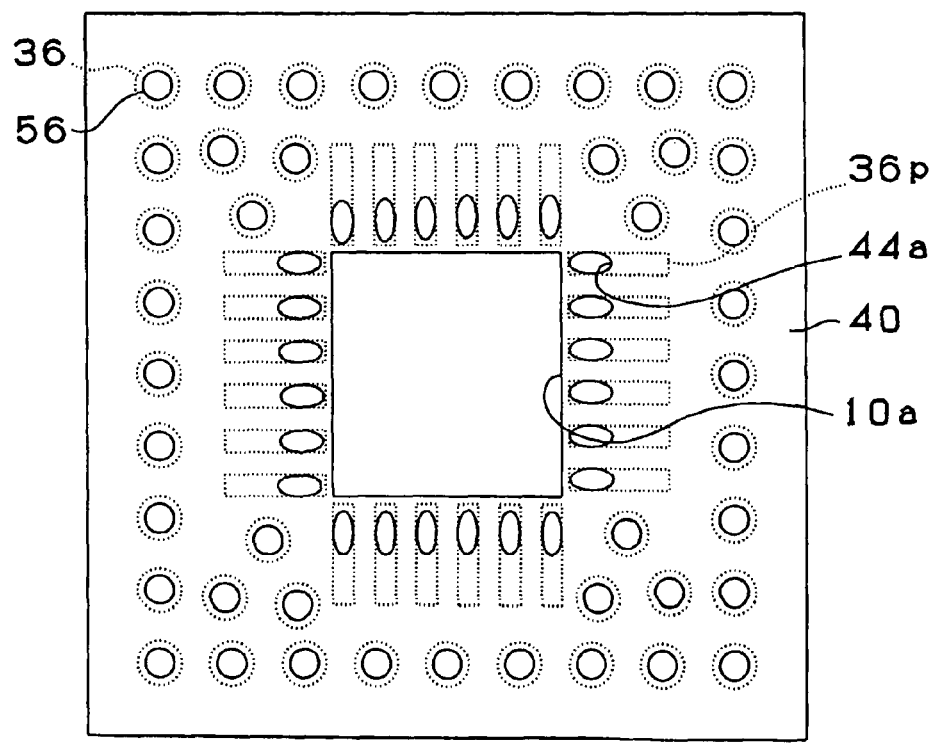

Fig. 20
(A)
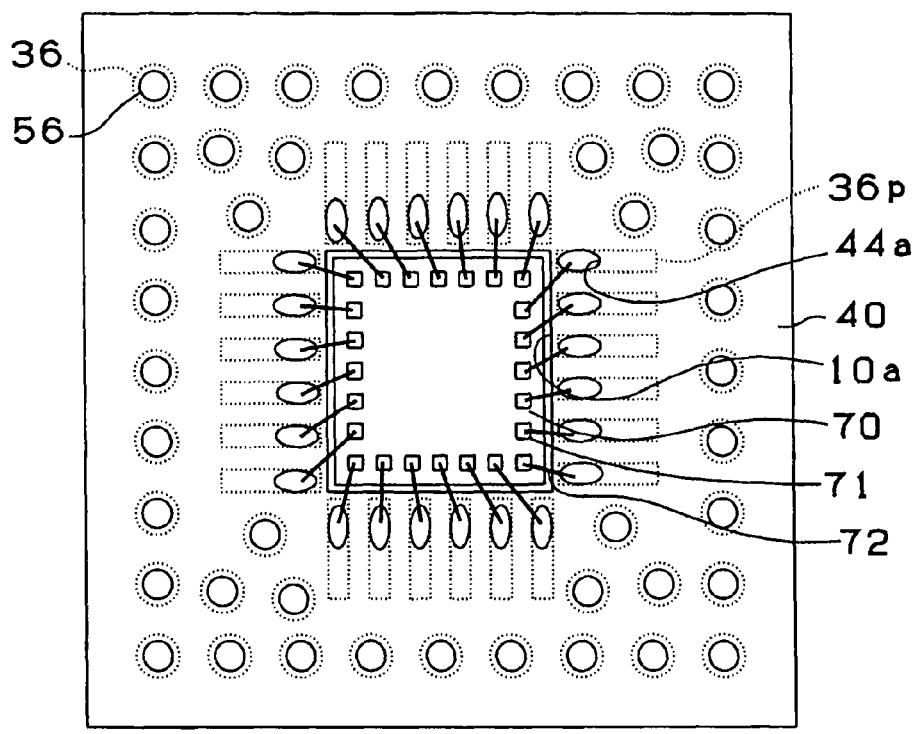
(B)
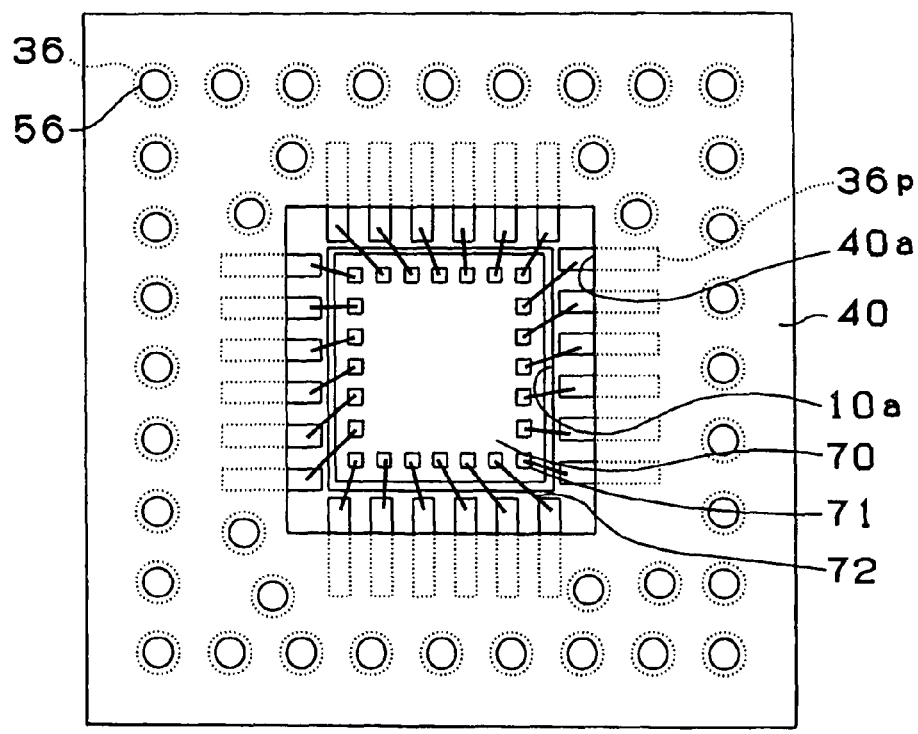

Fig. 22
(A)
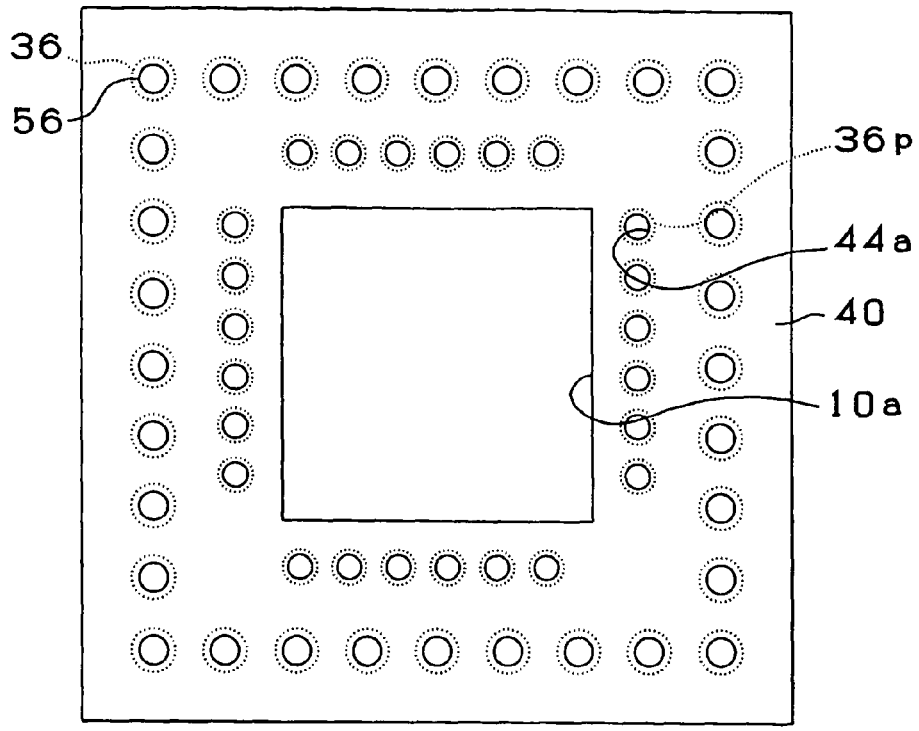
(B)
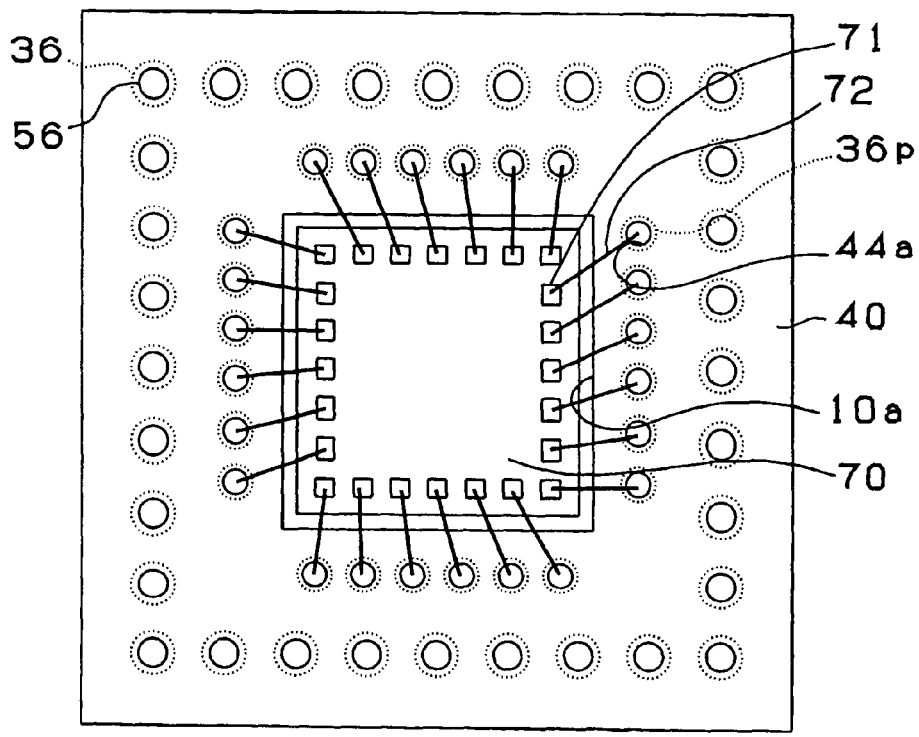

Fig. 23

| Classification | Inductance (pH) | Cycle | | | |
|---|---|---|---|---|---|
| | | 500 | 1000 | 2000 | 3000 |
| Example 2 | 84 | ○ | ○ | ○ | ○ |
| Modification 1 Of Example 2 | 83 | ○ | ○ | ○ | ○ |
| Modification 2 Of Example 2 | 84 | ○ | ○ | ○ | ○ |
| Modification 3 Of Example 2 | 83 | ○ | ○ | ○ | △ |
| Modification 4 Of Example 2 | 83 | ○ | ○ | ○ | △ |
| Change 1 Of Example 2 | 87 | ○ | ○ | ○ | △ |
| Change 2 Of Example 2 | 86 | ○ | ○ | ○ | △ |
| Change 3 Of Example 2 | 84 | ○ | ○ | △ | ▲ |
| Comparative Example 3 | 91 | ○ | △ | × | × |
| Comparative Example 4 | 92 | ○ | △ | ▲ | × |

○ : No Problem In Conduction Test On All Pieces
△ : Short-Circuit Occurrence In 1-2 Piece
▲ : Short-Circuit Occurrence In 3-4 Piece
× : Short-Circuit Occurrence In All Pieces Fig. 24
(A)
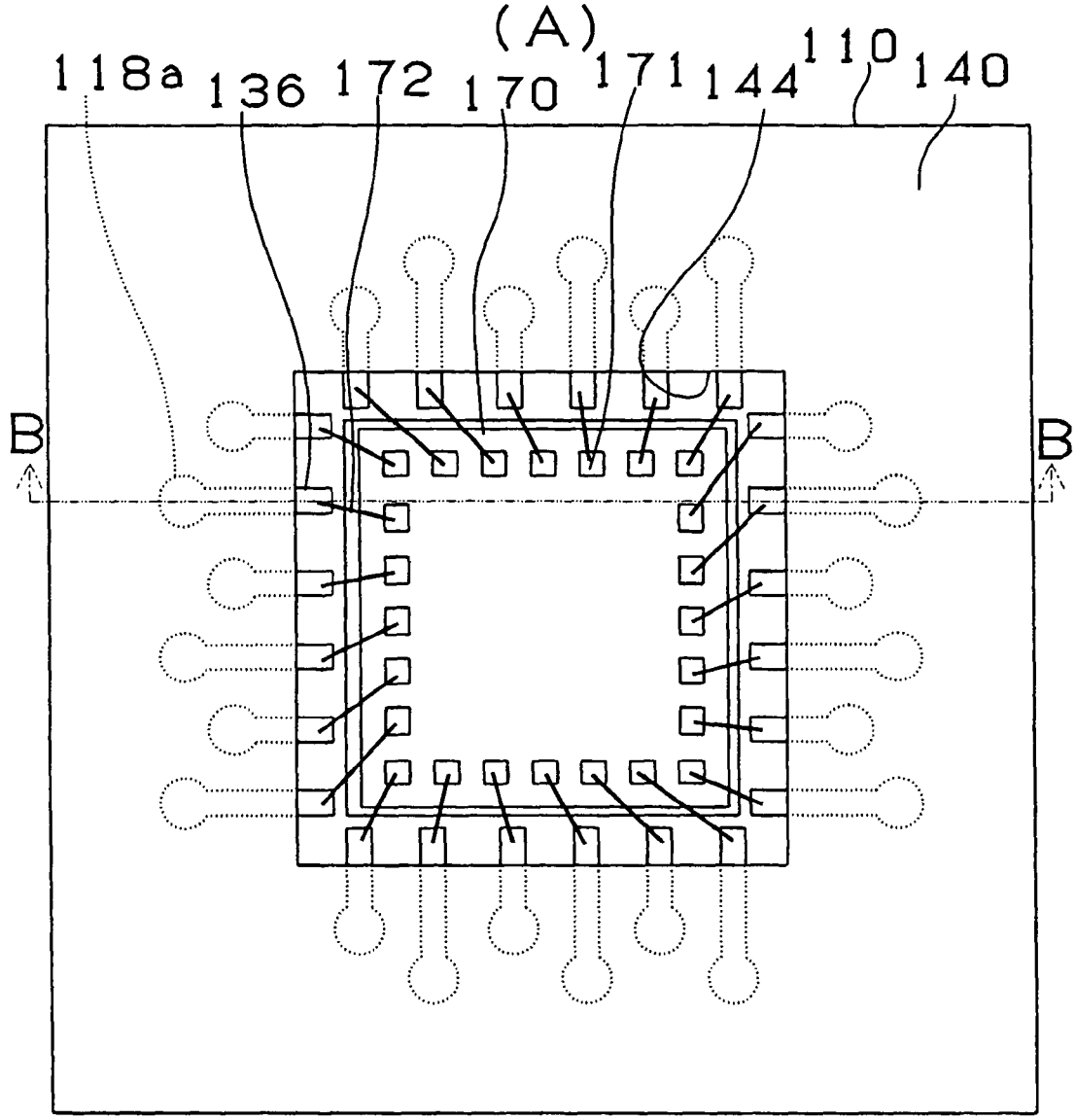
(B)
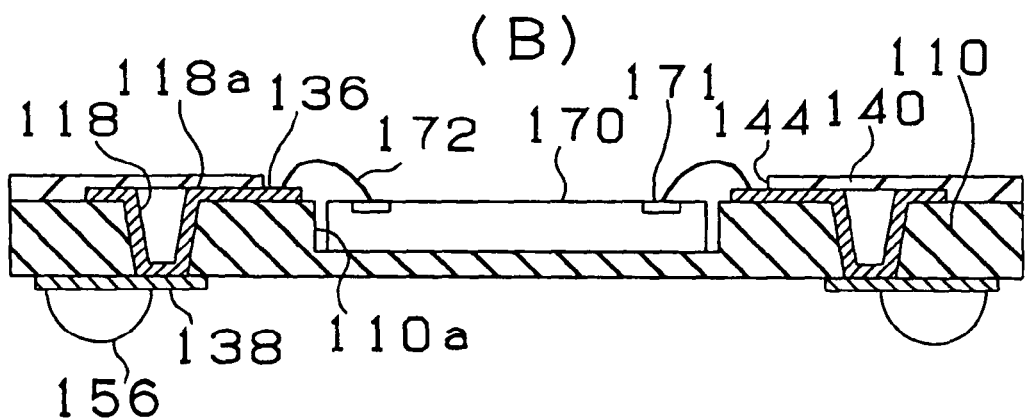

MULTILAYER PRINTED WIRING BOARD

TECHNICAL FIELD

The present invention relates to a multi-layer printed wiring board loaded with electronic components such as IC chips and more particularly to a multi-layer printed wiring board which enables the IC chip to be multi-layered and is not affected by stress and the like.

BACKGROUND ART

Technology which multi-layers an insulation substrate having IVH (inner via hole) structure while equipped with a conductive layer on one side has been proposed (for example, Japanese Patent Application Laid-Open No. HEI10-13028 and the like). This makes electric connection by connecting the conductive layer of one insulating base material with the via hole in the other insulating base material. Its function is exerted by mounting electric components such as IC chip and capacitor on a conductor circuit on an external layer appropriately. As a conventional art, Japanese Patent Application Laid-Open No. HEI10-13028 has been known.

FIG. 24 shows a printed wiring board for loading an IC chip according to a conventional art. FIG. 24(A) shows a plan view, and FIG. 24(B) shows a sectional view taken along the line B-B of FIG. 24(A). As shown in FIG. 24(B), a substrate 110 constituting a printed wiring board comprises a cavity 110a for accommodating an IC chip 170 and a via hole 118 for connecting the front face with the rear face. A rectangular bonding pad 136 is formed integrally on a land 118a of the via hole 118. A soldered bump 156 is connected to the rear face of the via hole 118 through a conductor circuit 138. The bonding pad 136 formed integrally with the via hole land 118a is projected from an opening 144 of soldered resist layer 140 so that its front end is exposed outside and wire-bonded with a terminal 171 of the IC chip 170 and wire 172.

Reduced thickness of film and intensified function of a substrate loaded with the IC chip have been demanded. The reason is that the casing of an electronic product such as portable phone, camera and personal computer has been reduced in size and thickness. To be accommodated in those casings, all the materials and components need to be thinned while keeping their function from dropping. Thus, constructing the IC chip in multi-layers so that its layers are stacked (in three dimensions) has been considered. According to the technology, an IC chip is loaded directly on an IC chip for multi-layer structure, that is, an upper IC chip is mounted on a lower IC chip by die bonding to stack layers. The layered IC chips are connected through the wire bonding. As a result, high density and small size can be achieved on the same area.

However, the substrate loaded with the layered IC chips cannot be repaired. Further, because connection is gained by wire bonding after the loading, the IC chip or the substrate cannot be inspected until the connection is gained by wire bonding. Thus, if there is even a single defect in the IC chip, the loaded substrate itself cannot be used.

Further, because no circuit is formed below the layered circuit or between IC chips, wiring cannot be placed around. Thus, with increase in clock number or the like, the wiring length prolongs. Upon a change in design or change in specification, appropriate formation by loading needs to be considered.

The present invention has been achieved to solve the above-described problems and an object of the invention is to provide a multi-layer printed wiring board which is easy to be multi-layered in terms of its structure and capable of withstanding changes in specification for design or the like.

Further, the board loaded with the IC chip has been demanded to have a higher wiring density. For this purpose, bonding pads for wire bonding need to be disposed in high density. However, because shown in FIG. 24(A), if the bonding pad 136 is formed integrally with a via hole land 118a, the via hole land 118a whose external shape is larger than the line width of the bonding pad 136 is disposed, the bonding pads cannot be disposed in high density.

The present invention has been achieved to solve the above-described problem and another object of the invention is to provide a multi-layer printed wiring board which enables the wiring density of the wire bonding to be intensified.

DISCLOSURE OF THE INVENTION

As a result of research by the inventor, as a multi-layer printed wiring board loaded with an electronic component such as an IC chip and having external terminals, a structure in which the external terminals are disposed on both faces thereof has been proposed to solve the above-described problem.

Because the both faces of the multi-layer printed wiring board have a pad for connecting to the external terminal, other printed wiring board can be connected to the both faces. For example, with other IC module mounted through the external terminals on the front face, this printed wiring board can be connected to a printed wiring board through the external terminal on the rear face. Freedom in the configuration of the IC module to be mounted increases. Especially, it is preferable to dispose an external terminal just under the IC chip. As a consequence, freedom of wire to be drawn increases and further, the IC chip turns into a structure which enables the IC chips to be stacked in multiple layers. To reduce an area necessary for wiring, the size of a substrate is reduced.

If looking in another way, as a circuit formed on the multi-layer printed wiring board, two kinds of circuits, a circuit (PGK circuit) introduced outside by connecting to the IC chip mounted on the substrate and a circuit (interposer circuit) introduced outside through the multi-layer printed wiring board connected to the IC module are mixed. To connect these effectively, it is preferable to form an external terminal on each of both faces. This can take roles of the interposer and PKG substrate with a single piece, thereby achieving reduction in size and intensification of function. Even if a fault occurs in the multi-layer printed wiring board or another board, this can be inspected. This can be done before other substrate (IC module) is attached to the multi-layer printed wiring board. Even if another substrate (IC module) is redesigned (for example, in case of memory, if means that its capacity is changed), it can meet easily.

The technical feature of the present invention exists in a multi-layer printed wiring board loaded with an electronic component such as an IC chip and having external terminals, wherein a bored portion for accommodating an electronic component is provided in a mounting area and the external terminals are formed on both faces. The external terminals mentioned here means a terminal which can be connected outside such as BGA, PGA, bump (solder or metal).

Because the bored portion is formed, the thickness of the mounting area (thickness in a condition in which the IC chip is mounted on the multi-layer printed wiring board) can be reduced. Further, even if the IC chip is constructed into multi-layers, the total thickness of the entire substrate including sealed resin can be reduced.

According to the above-described double face structure, for example, with a printed wiring board loaded with an IC chip connected to the single side of the multi-layer printed wiring board, other substrate loaded with an electronic component than the IC chip can be connected to the opposite face. In other words, this can take a role just like an interposer. If printed wiring boards including the IC chip are connected to both faces, this can turn to a stacked structure (three-dimensional structure). Particularly, the external terminal can be formed in an area below the IC chip.

As shown in FIG. 13, preferably, an external terminal 56 located just below on the opposite face does not overlap the external terminal 56. Here, (A1), (B1), (C1) indicate an external terminal in FIG. 2 and (A2), (B2), (C2) are perspective views of the external terminals in (A1), (B1), (C1). This means that an area which the external terminal on the opposite side makes contact with does not overlap an area which the external terminal keeps contact with, located just below. As a consequence, stress generated on the external terminal is prevented from being transmitted directly, thereby preventing positional deflection and contact failure of the terminal and reduction in electric contact and reliability. Because the external terminal is mainly BGA (ball grid array), bump or the like, its connecting portion is smaller as compared with the external terminal such as conductive bump and stress is likely to be concentrated. Further, although stress is generated due to an external factor such as generation of heat (for example, heat cycle condition) which originates from a difference in thermal expansion coefficient of materials from other printed wiring board and that stress is transmitted to the external terminal on the opposite side, the stress is relaxed by the substrate or external terminal. Thus, the external terminal on the opposite face is not affected. If the stress is transmitted directly, defects such as peeling, crack and contact failure with an outside substrate occur at the connecting portion of the external terminals on the opposite face.

Further, preferably, the external terminal on the opposite face does not overlap the external terminal on the one face or pad area of that external terminal (including land depending on case) located just below. When conductive material such as plating, conductive paste is applied under the bottom of the pad of the external terminal, the pad area can be affected by that stress. By disposing a connecting area of the external terminal on the opposite face off that area, it is possible to protect from an influence of the stress securely.

Preferably, in the mounting area of the electronic component, a via hole is formed and metal layer having a heat radiation function is formed at a portion in the vicinity. Particularly, it is preferable to provide metal layer just below the IC chip and connect that metal layer to the external terminal through the via hole (non-through hole). With this structure, heat can be transmitted to the printed wiring board side connected to the external terminal efficiently to radiate heat.

The external terminal is connected to the via hole in stacked condition and the via hole connected to the external terminal is preferred to be deflected from the via hole in an adjacent layer in terms of their center line (X1, X2) as shown in FIG. 13.

If the external terminals are formed just on a stacked structure, stress generated on one external terminal is transmitted directly into the substrate. Thus, the inside of the substrate and the external terminal on the opposite face are affected. If inside the substrate, connection of the stacked via holes is blocked and in case of the external terminal on the opposite face, contact failure is induced. However, if the via holes are formed in the stacked condition with their center lines deflected from each other, transmission of the stress is damped. An effect is generated if the inside of the via hole is filled with plating or conductive paste. Filling with the conductive material makes it easy to transmit stress.

Optimally, the multi-layer printed wiring board of the present invention is constructed by overlaying two or more of the single side circuit board or double side circuit board in which the non-through holes formed in insulating material are filled with conductive material. As its manufacturing method, subtractive method or additive method (including build-up method) is applicable. However, according to the subtractive method, if an external terminal is disposed on the structure having a through hole going through two or more layers, stress cannot be damped. Thus, this method cannot be applied depending on case.

As for the build-up method, if the resin insulating layer containing no core material is used, forming the bored potion makes it difficult to stabilize the configuration of the resin insulating material. Thus, this method cannot be applied depending on the case.

It is preferable to use the single side circuit. The melting point of the conductive bump for connecting the single side or double side circuit boards is desired to be higher than the melting point of adhesive agent (for example, solder for bonding the BGA) for the external terminal. As a result, melting of the conductive bump itself can be blocked. Conversely, if the melting pint of the conductive bump is lower than the melting point of the adhesive agent of the external terminal, when the external terminal is mounted, quite a large part of the conductive bump is melted by that temperature so that it flows out within the substrate. If its flow area is large, the conductive bump causes a short-circuit with an adjacent conductive layer. On the other hand, if the flow area is small, stress is generated between substrates. Unless the stress is relaxed, positional deflection is induced. Thus, the thickness of the conductive bump decreases so that adhesion strength and electric characteristic drop.

Particularly, the melting point is desired to be 200° C. or more to 350° C. or less. Because the melting point is less than 200° C., a difference of the melting point relative to solder on the surface layer is small or decreased, when the IC chip is mounted, melting or diffusion is induced so that a short-circuit can be generated with an adjacent independent conductor circuit. If the melting point is over 350° C., the metal itself becomes too hard, thereby its connectivity dropping. Thus, connection with the conductor circuit can be disabled. Further, because resin as the insulation material is melted if it is intended to melt at that temperature, the insulation characteristics of the insulation material lowers.

Further, the temperature is more preferred to be in a range of 220° C. to 320° C. In that range, the conductive bump is not diffused even in reliability test under high temperature/high humidity or heat cycle condition. As the conductive bump, it is permissible to use solder of Sn/Pb, Sn/Ag, Su/Cu, Sn/Zn, Sn/Sb, Sn/Ag/Cu and metal such as tin, zinc. At this time, the melting point is preferred to be 200° C. or more to 350° C. or less.

By mixture of Cu, Zn or Sb in the above-described conductive bump, flow of the metal itself can be blocked. That is, Cu alloy, Zn alloy or Zn alloy is formed in re-solidified metal. This prevents the alloy from being melted by heat generated when it is mounted thereby suppressing defects such as diffusion of conductive metal. Thus, the possibility of short-circuit is diminished to improve the electric characteristic.

Even if at the time of reliability test by heat cycle test or by leaving under high temperatures, it is left at the time of temperature rise (low temperature to high temperature) or high temperatures, re-melting of solidified conductive metal is suppressed. Thus, the reliability test can be improved.

Further, after the reliability test, adhesion strength between the conductive layer and via hole does not drop. Thus, electric characteristics does not drop neither and consequently, the electric characteristic can be improved. In conductive metal containing Cu, Zn or Sb, the fluidity of metal itself is suppressed. For the reason, the via hole pitch can be narrowed more so that it is possible to obtain a multi-layer printed wiring board formed in high density.

As a result of research by the inventor, to solve the above-described problem, the technical feature of the present invention exists in a multi-layer printed wiring board in which a mounted electronic component is wire-bonded from a bonding pad, a substrate being so constructed that a conductive circuit is formed on a single side or double sides of insulation material thereof and the non-through hole leading to the conductor circuit is filled with conductive material.

Further, the technical feature of the present invention exists in a multi-layer printed wiring board in which a mounted electronic component is wire-bonded from a bonding pad, a substrate being so constructed that a conductive circuit is formed on a single side or double sides of insulation material thereof and the non-through hole leading to the conductor circuit is filled with conductive material, the substrates being overlaid through conductive bump formed on conductive material filled in the non-through hole, the conductor circuit just above the non-through hole filled in the non-through hole being used as the bonding pad.

According to the present invention, by using the conductor circuit just above the conductor material filled in the non-through hole as a bonding pad, wire can be pulled out to the lower layer through the non-through holes without pulling out the conductor circuit outward of the substrate from the conductor circuit and due to the non-through hole, no through hole area needs to be secured over an entire layer like in the case of a through hole and the wire can be arranged freely. Thus, although the wiring in the bonding pad area can be performed in high density, dead space due to unreasonable wiring is eliminated from the surrounding thereby freedom of wiring being increased.

Further, the technical feature of the present invention exists in a multi-layer printed wiring board in which a mounted electronic component is wire-bonded from a bonding pad, a substrate being so constructed that a conductive circuit is formed on a single side or double sides of insulation material thereof and the non-through hole leading to the conductor circuit is filled with conductive material, the non-through hole being disposed just below the bonding pad by using the conductor circuit just above the non-through hole as the bonding pad.

Further, the technical feature of the present invention exists in a multi-layer printed wiring board in which a mounted electronic component is wire-bonded from a bonding pad, a substrate being so constructed that a conductive circuit is formed on a single side or double sides of insulation material thereof and the non-through hole leading to the conductor circuit is filled with conductive material, and the substrates being overlaid through conductive bump formed on conductive material filled in the non-through hole, the non-through hole being disposed just below the bonding pad by using the conductor circuit just above the non-through hole as the bonding pad.

In the present invention, the conductor circuit connected directly to conductive material filled in the non-through hole is used as bonding pad. That is, because the conductor circuit (bonding pad) is connected to the via hole by filling the non-through hole leading to the conductor circuit (bonding pad) with conductive material, the conductive material (via hole) and the conductor circuit (bonding pad) can be connected without any via hole land. Because the via hole land having a diameter larger than the line width of the bonding pad is not employed, the wiring density can be intensified.

Wire can be pulled out to the lower layer through the non-through holes without pulling out the conductor circuit outward of the substrate from the conductor circuit and due to the non-through hole, no through hole area needs to be secured over an entire layer like in the case of a through hole and the wire can be arranged freely. Thus, although the wiring in the bonding pad area can be performed in high density, dead space due to unreasonable wiring is eliminated from the surrounding thereby freedom of wiring being increased.

As the conductive material, plating and conductive paste can be used. It is preferable to use plating. The reason is that the conductive paste can cause a sinking after wire is placed.

(Cu Containing Metal Bump)

Because Cu is mixed in the conductive bump, diffusion of metal itself can be suppressed. That is, in the metal of solidified conductive bump, Cu alloy is formed. The alloy prevents melting of metal even if it is affected by various kinds of thermal history (for example, annealing, plating, IC chip mounting process and the like) applied to the substrate thereby suppressing defects such as diffusion of conductive bump metal. Thus, changes in resistance, short-circuit and deterioration of electric performance are suppressed to improve electric characteristics.

Even if at the time of reliability test by leaving under high temperatures or by heat cycle test, it is left under high temperatures or under a temperature rise (low temperature to high temperature), re-melting or diffusion of solidified conductive bump is suppressed.

Further, because invasion of water into an interface between the conductive bump and conductive portion is suppressed, generation of expansion and contraction due to existence of water content on the interface is eliminated. Because no partial electric insulation (meaning that the water content forms a gap) in the vicinity of the interface is generated, electric connectivity is secured. Thus, reliability test can be improved.

Further because no water invades into between the conductive layer and via hole after the reliability test is carried out, adhesion strength is not dropped. If water invades, expansion can occurs due to that water when the temperature rises. As a consequence, gap is formed or crack is generated so that adhesion property drops. Because they are not generated, drop in strength due to decrease in contact condition is eliminated to improve the reliability.

Conductive metal containing Cu is capable of suppressing diffusion of metal. Thus, the via hole pitch can be narrowed more and consequently, a high density multi-layer printed wiring board can be obtained.

Alloy layer of Cu-conductive metal is formed on the interface between the solidified conductive metal and conductor circuit. The formed alloy film serves as protective film to prevent the metal of the other portion of the conductive metal from flowing. Due to the formation of that film, formation of new Cu alloy, particularly, formation in the conductor circuit is blocked even if influence of heat such as thermal history and thermal process is received, thereby preventing the conductive metal from flowing.

For the aforementioned conductive bump, it is preferable to use any one of Sn—Pb—Cu, Sn/Cu, Sn/Ag/Cu, Sn/Ag/In/Cu, Sn/Cu/Zn. Because Cu is mixed in these, the above-described operation and effect can be obtained by using the conductive bump.

Because metallic material using lead is limited in its usage as it can become a factor for deteriorating the environment, it is preferable to use metallic material not using lead. However, any composition other than this can be used as long as Cu is mixed. The mixture ratio of Cu in the conductive bump is preferred to be 0.1 to 7 wt %.

Because if it is less than 0.1 wt %, the amount of Cu alloy formed after its solidification is small, when it is re-melted, flow of the conductive bump cannot be suppressed. Thus, connection with another conductive layer adjacent is likely to occur. Further, a portion in which no Cu alloy film is formed is generated partially on the interface between the conductive metal and conductor circuit. Melting and diffusion of the conductive metal is generated from that portion in which no Cu alloy film is formed. If it exceeds 7 wt %, the melting point rises, so that if it is heated, it is difficult to melt. Thus, the conductive bump itself becomes hard. Because the conductor layer hardens when the conductor layer is brought into contact with the via hole, contact failure occurs in the conductor or crack occurs in the conductor, so that its electric connectivity and adhesion property drop.

In the above-mentioned range, the fluidity of the conductive bump can be suppressed and Cu alloy can be formed appropriately to secure adhesion property with the conductor.

The reason why the mixture ratio of Cu in the conductive bump is preferred to be 0.5-5 wt % is that the adhesion strength can be increased. Because its hardness is appropriate and it can spread uniformly between the conductors, the electric connectivity is improved. Further, the adhesion property can be improved regardless of the kind of the conductive metal (plating, conductive paste, and compound thereof) filling the via hole having the conductive bump.

(Zn Containing Metal Bump)

Because Zn is mixed in the conductive bump, diffusion of the metal itself can be suppressed. That is, Zn alloy is formed in the metal of solidified conductive bump. That alloy prevents the metal from being melted even if an influence of various thermal histories (for example, annealing, plating, IC chip mounting process and the like) applied to the substrate is received so as to suppress defects such as diffusion of conductive bump metal. Thus, changes in resistance, short-circuit and deterioration of electric performance are suppressed to improve the electric characteristics.

Further, even if at the time of reliability test by leaving under high temperatures or by heat cycle test, it is left under high temperatures or under a temperature rise (low temperature to high temperature), re-melting and diffusion of the solidified conductive bump are suppressed.

Zn on an interface between the conductive bump and conductor portion or Zn alloy layer blocks invasion of metal in the conductor circuit. That is, the Zn layer acts as a barrier layer. If heterogeneous substance is formed on the interface, substance having different melting point and thermal expansion is formed as compared with other portions. As a consequence, expansion and contraction occur because of the heterogeneous substance, so that partial stress is generated in the vicinity of the interface and thus, no insulation property is secured. Thus, the reliability drops.

Because no water invades into between the conductive layer and via hole after the reliability test is performed, the adhesion strength is not dropped. If water invades, expansion can occur due to that water when the temperature rises. As a result, a gap is formed and crack is generated so that adhesion property drops. Because such phenomenon does not occur, drop in strength due to drop in degree of contact is eliminated, thereby the reliability being raised.

The Zn containing conductive metal is capable of suppressing diffusion of the metal. The reason is that the melting point is likely to rise. Thus, the via hole pitch can be narrowed more, so that a high density multi-layer printed wiring board can be obtained.

Alloy layer of Zn-conductive metal is formed on an interface between the solidified conductive metal and conductor circuit. The formed alloy film turns to protective film to prevent the metal of the other portion of the conductive metal from flowing. Because even if an influence of heat such as thermal history and thermal process is received, due to the formation of that film, formation of new Zn alloy, particularly formation of the conductor circuit is prevented, thereby suppressing flow of the conductive metal.

It is preferable that any one of Sn/Zn, Sn/Ag/Zn, Sn/Cu/Zn is used for the aforementioned conductive bump. Because Zn is mixed in these components, the above-described operation and effect are obtained by using the conductive bump.

Further, because the metallic material using lead is limited in usage as it can turn to a factor which deteriorates the environment, it is preferable to use metallic material using no lead. However, composition of the solder other than this can be used as long as Zn is mixed therein.

The mixture ratio of Zn in the conductive bump is preferred to be 0.1-10 wt %.

Because if it is less than 0.1 wt %, the amount of Zn alloy formed after its solidification is small, when it is re-melted, flow of the conductive bump cannot be suppressed. Thus, connection with another conductive layer adjacent is likely to occur. Further, a portion in which no Zn alloy film is formed is generated partially on the interface between the conductive metal and conductor circuit. Melting and diffusion of the conductive metal is generated from that portion in which no Zn alloy film is formed.

If it exceeds 10 wt %, the melting point rises, so that if it is heated, it is difficult to melt. Thus, the conductive bump itself becomes hard. Because the conductor layer hardens when the conductor layer is brought into contact with the via hole, contact failure occurs in the conductor or crack occurs in the conductor, so that its electric connectivity and adhesion property drop.

In the above-mentioned range, the fluidity of the conductive bump can be suppressed to secure adhesion property with the conductor. The reason why the mixture ratio of Zn in the conductive bump is preferred to be 0.5-9 wt % is that the adhesion strength can be increased. Because its hardness is appropriate and it can spread uniformly between the conductors, the electric connectivity is improved. Further, the adhesion property can be improved regardless of the kind of the conductive metal (plating, conductive paste, and compound thereof) filling the via hole having the conductive bump.

It is permissible to use metal containing antimony. In this case, antimony takes the same role as lead. That is, antimony takes a role as barrier layer to prevent formation of alloy layer with copper. The mixture ratio of antimony is preferred to be 0.1-10%. Because if it is less than 0.1 wt %, the amount of antimony alloy formed after its solidification is small, when it is re-melted, fluidity of the conductive bump cannot be suppressed. Thus, connection with another conductive layer adjacent is likely to occur. Further, a portion in which no antimony alloy film is formed is generated partially on the interface between the conductive metal and conductor circuit. Melting and diffusion of the conductive metal is generated from that portion in which no antimony alloy film is formed.

If it exceeds 10 wt %, the melting point rises, so that if it is heated, it is difficult to melt. Thus, the conductive bump itself becomes hard. Because the conductor layer hardens when the conductor layer is brought into contact with the via hole, contact failure occurs in the conductor or crack occurs in the conductor, so that its electric connectivity and adhesion property drop. In the above-mentioned range, the adhesion with the conductor can be secured while suppressing fluidity in the conductive bump.

In addition to these, it is permissible to use generally used solder paste or conductive paste such as Sn/Pb, Sn/Ag, Sn/Ag/Cu.

(Description of Single Side Circuit Board)

For the single side circuit board as a basic unit which constitutes the multi-layer printed wiring board of the present invention, it is desirable to use hard single side copper foil attached resin base material formed of completely hardened resin material as insulating base material. Because due to application of such a substrate, a deflection of final dimension of the insulating base material due to pressing is diminished (no contraction) when other single side board is pressed by heat pressing to form the multi-layer structure, the positional deflection of the via hole can be suppressed to its minimum extent thereby reducing the diameter of the via land. Therefore, the wiring pitch can be reduced to improve the wiring density. Further, because the thickness of the substrate can be maintained constant, if an opening for forming a filling via hole described later is formed by laser processing, laser irradiation condition can be set easily.

As the insulating resin base material, it is preferable to use hard substrate selected from glass fabric epoxy resin base material, glass fabric bsmaleimide-triazine resin base material, glass fabric polyphenylene ether resin base material, aramid unwoven fabric-epoxy resin base material, aramid unwoven fabric—polyimide resin base material and glass fabric epoxy resin base material is most preferable. Additionally, it is permissible to use thermo setting resin such as polyimide, compound material, photo sensitive resin and photo curing resin as the thermoplastic resin. Inorganic filler such as glass, alumina, zirconia may be dispersed in the resin of the insulating resin base material.

The thickness of the insulating base material is preferred to be 20-600 μm. The reason is that if the thickness is less than 20 μm, the strength drops so that it becomes difficult to handle and reliability on the electric insulation property lowers. Another reason is that shape holding characteristic when a bored portion is formed can drop. Still another reason is that if it exceeds 600 μm, a fine opening for formation of the via hole becomes difficult to form and the substrate itself becomes thick.

The conductor layer or the conductor circuit formed on a single side of the insulating base material is formed by bonding copper foil to the insulating base material via appropriate resin adhesive agent and etching that copper foil.

Preferably, the aforementioned conductor layer is formed by pressing the copper foil of 5-50 μm thickness with heat onto the insulating base material via resin adhesive agent layer held in semi-hardening condition and as for the conductor circuit, after the copper foil is pressed with heat, a photo sensitive dry film is bonded to the copper foil face or liquid photo sensitive resist is applied and with a mask having a predetermined wiring pattern placed, plating resist layer is formed by exposure to light and development and after that, the copper foil at a portion in which no etching resist is formed is etched to form that conductor circuit.

After the conductor circuit is formed, an opening is made with router or by laser or punching. The size of the opening is, if considering the substrate as a single piece, preferred to be 10-70% the area of that substrate. Because if it is less than 10%, the formation area of the bored portion is small, a merit of the formation is little. Because if it exceeds 70%, a strength withstanding pressing cannot be maintained and the area for forming the external terminal decreases, the IC chip to be mounted may be limited.

The pressing of the copper foil onto the insulating base material with heat is carried out at an appropriate temperature and under an appropriate pressure and more preferably, it is carried out under a reduced atmospheric pressure, and because the copper foil is bonded firmly to the insulating base material by hardening only the resin adhesive agent layer in the semi-hardening condition, manufacturing time is reduced as compared with a conventional circuit substrate using prepreg.

If any bored portion is formed at this time, it is preferable to use protective film to protect the bored portion and prevent flow of adhesive agent on the interface.

Instead of bonding of the copper foil onto the insulating base material, it is permissible to adopt a single side copper stretched laminated board in which the copper foil is bonded on the insulating base material and etch this single side copper stretched laminated board with at least one selected from sulfuric acid-hydrogen peroxide, persulfate, cupric chloride and ferric chloride solutions.

Preferably, a land (pad) is formed on the surface corresponding to each via hole in the conductor circuit as part of the conductor circuit such that the diameter thereof is in a range of 50-250 μm.

If the via holes are provided in a stacked condition, it is desirable to deflect the center lines of the via holes from each other. As a result, the stress which is transmitted through the stacked structure can be damped.

Preferably, roughing layer is formed on the surface of a wiring pattern of the conductor circuit to improve adhesion with adhesive agent layer for bonding together the circuit substrates, thereby preventing generation of separation (delamination).

As the roughing treatment method, for example, soft etching treatment, blacking (oxidation)—reduction treatment, formation of needle-like alloy plating of copper-nickel-phosphorus (made by EBARA YUJIRAITO; product name, INTERPLATE) and surface roughing with etching solution named "MEC ETCH BOND" made by MEC are available.

Preferably, the opening for formation of the via hole formed such that it reaches the conductor circuit from the surface on an opposite side to the surface of the insulating resin base material having such a conductor circuit is formed with carbon dioxide laser projected under a condition of pulse energy of 0.5-100 mJ, pulse width of 1-100 μs, pulse width of more than 0.5 ms and number of shots of 3-50 and the diameter of its opening is preferred to be in a range of 50-250 μm.

The reason is that if it is less than 50 μm, it is difficult to fill the opening with conductive substance and connecting reliability drops and if it exceeds 250 μm, forming in high density is difficult.

Before forming the opening with carbon dioxide laser, preferably, resin film is bonded to the surface on an opposite side to the conductor circuit forming face of the insulating base material and the resin film is irradiated with laser.

This resin film functions as protective mask upon filling the inside of an opening with metallic plating by electrolytic plating treatment after de-smear treatment of the inside of the opening for formation of the via hole and further as a printing mask for forming a projecting conductor (conductive bump) just above the metallic plating layer of the via hole.

As for the resin film, its adhesive agent layer is 1-20 μm thick and preferably, it is formed with PET film whose thickness is 10-50 μm.

The reason is that because the height of the projecting conductor described later is determined depending on the thickness of the PET film, if the thickness is less than 10 μm, the projecting conductor is so low that contact failure is likely to occur and if the thickness is over 50 μm, the projecting conductor spreads so much on a connecting interface, that a fine pattern cannot be formed.

To form the via hole by filling the inside of the opening for formation of the via hole with conductive material, it is desirable to fill with plating or conductive paste.

Although filling with conductive paste is suitable to simplify the filling process to reduce manufacturing cost and improve yield, contraction by hardening can become too large depending on the composition ratio in the paste (conductive metal, resin, hardening agent and the like). Plating is more desirable from viewpoint of the shape after the filling and connecting reliability.

Although the aforementioned filling with plating can be carried out by electrolytic plating treatment or electroless plating treatment, metallic plating formed by electrolytic plating treatment, for example, metallic plating with tin, silver, solder, copper/tin, copper/silver or the like is preferable, particularly, electrolytic copper plating is optimal.

When filling by the electrolytic plating treatment, with protective film bonded to the copper foil bonding face (conductor circuit forming face) of the insulating base material, the electrolytic plating is performed with the copper foil formed on the insulating base material as plating lead. Because this copper foil (metallic layer) is formed over an entire surface of one of the insulating base material, current density is equalized and consequently, the opening for formation of the via hole can be filled with electrolytic plating in a uniform height.

Before the electrolytic plating, it is recommendable to activate the surface of the metallic layer within the non-through hole with acid.

Further, preferably, after the electrolytic plating is carried out, the electrolytic plating (metal) swollen from an opening edge is removed by belt sander polishing, buffing or the like so that it is flattened.

Instead of filling with conductive substance by plating treatment, it is permissible to apply a method of filling with conductive paste or fill part of the opening by electrolytic plating treatment or electroless plating treatment while filling a remaining portion with conductive paste.

As the conductive paste, it is permissible to use conductive paste composed of metallic particles of at least one kind selected from copper, tin, gold, silver, nickel and various kinds of solders.

As the metallic particle, it is permissible to use the one whose surface is coated with heterogeneous metal. More specifically, a metallic particle obtained by coating the surface of copper particle with precious metal selected from gold and silver can be used.

As the conductive paste, organic conductive paste obtained by adding thermal setting resin like epoxy resin or polyphenylene sulfide (PPS) resin to metallic particle is desirable.

Because the opening formed by the laser processing has a fine diameter of 20-150 μm, bubbles are likely to be left when filling with conductive paste. Thus, filling by electrolytic plating is practical.

As for the via hole to be formed in the single side circuit board, its arrangement density is the largest in case of a single side circuit board to be overlaid outside for loading with LSI chip or the like and it is the smallest in case of other single side circuit board outside to be connected to a mother board. That is, preferably, a distance between the via holes formed in respective circuit boards to be overlaid increases as it goes from a circuit board on the side loaded with the LSI chip or the like to a circuit board on the side to be connected to the mother board. With such a structure, the ability of placing wire around is improved.

Upon manufacturing the multi-layer printed wiring board of the present invention, preferably, the single side circuit board as a basic unit to be overlaid is provided with the projecting conductor or conductive bump on the via hole so as to secure electric connection with other single side circuit board.

Preferably, this conductive bump is formed by filling the inside of the opening in the protective film formed by irradiation of laser with plating or conductive paste.

Although the filling with plating can be carried out by electrolytic plating treatment or electroless plating treatment, the electrolytic plating treatment is preferable.

Although the electrolytic plating can use copper, gold, nickel, tin and various kinds of solders, which have a low melting point, plating with tin or plating with solder is optimal.

The height of the conductive bump is preferred to be in a range of 3-60 μm. The reason is that if it is less than 3 μm, a deflection of the height of the bump is not allowable due to deformation of the bump and if it exceeds 60 μm, the resistance value increases and when the bump is formed, it spreads laterally thereby causing a short-circuit.

If the conductive bump is formed by filling with conductive paste, deflection of the height of electrolytic plating forming the via hole is corrected by adjusting the amount of conductive paste to be filled so that the heights of many conductive bumps can be arranged uniformly.

The bump composed of conductive paste is preferred to be in semi-hardening condition. The reason is that the conductive paste is hard even in the semi-hardening condition and it can penetrate into organic adhesive agent layer softened at the time of heat pressing. Another reason is that not only it deforms at the time of heat pressing so that its contact area increases thereby reducing conduction resistance but also the deflection of the height of the bumps can be corrected.

Additionally, the conductive bump can be formed according to, for example, a method of screen-printing the conductive paste using a metal mask having an opening at a specified position, a method of printing solder paste of low melting point metal, a method of dipping into melted solder solution or by electroless or electrolytic plating.

The low melting point metals preferable to use include Sn—Ag base, Sn—Sb base solder, Sn—Pb base solder, Sn—Zn base solder, Sn—Pb—Cu base solder, Sn—Cu base solder, Ag—Sn—Cu base solder, In—Cu base solder, Sn—Cu—Zn base solder which contain Cu. More specifically, Sn/Pb/Cu, Sn/Cu, Sn/Ag/Cu, Sn/Ag/In/Cu, Sn/Cu/Zn, Sn/Zn, Sn/Sb, Sn/Sb/In and metals such as tin and lead can be mentioned. Basically, it is preferable to use solder containing Cu, Zn or Sb. The reason is that they are capable of suppressing fluidity of conductive paste and under reliability test under high temperature/high humidity or under heat cycle, more excellent than other materials in terms of electric connectivity and reliability.

In the multi-layer printed wiring board of the present invention, as described above, plural pieces of the single side circuit boards in which a conductor circuit is formed on a single side of insulating base material thereof are overlaid in a predetermined direction and copper foil whose one face is subjected to mat treatment is pressed against the surface on the conductive bump side of the single side circuit board disposed inside of those single side circuit boards such that the mat face opposes so as to form a conductor circuit having a predetermined wiring pattern by etching treatment.

The mat face of the copper foil is preferred to be formed by well known etching, electroless plating, oxidation-reduction treatment or the like, particularly, it is preferred to be formed by etching.

For the etching treatment, cupric chloride, ferric chloride, persulfates, hydrogen peroxide/sulfuric acid, alkali etchant, and etching solution using organic acid and cupric complex are available.

For the electroless plating treatment, electroless plating for a single layer of copper, nickel, aluminum, displacement plating, composite coatings of copper—nickel—phosphorus are available.

As the oxidation reduction treatment, a treatment by reduction bathing as blacking bathing and alkali bathing with sodium is available.

Although adhesion property between the mat treated copper foil and insulating resin base material differs depending on resin viscosity, thickness of the copper foil, heat press pressure and the like, if the insulating resin base material is hard resin base material and the thickness of the copper foil is in a range of 5-50 µm, preferably, the roughness of the mat face of the copper foil is in a range of 0.1-5 µm, the temperature is 120-250° C., the heat pressing pressure is in a range of 1-10 Mpa, and consequently, the peeling strength is in a range of 0.6 to 1.4 Kg/cm$^2$.

Because the mat face of the copper foil is pressed against not only the face on the conductive bump side of the single side circuit board but also the conductive bump projecting form that face, adhesion property between the conductor circuit formed by etching the copper foil and the face on the conductive bump side and between the conductor circuit and the conductive bump is improved.

Generally, because if the single side circuit boards are overlaid into a multi-layer structure in the same direction, heating process such as drying and annealing is repeated after dipped in plating solution or cleaning liquid, stress applied to a portion in which no conductor circuit exists of the metallic layer is not damped. Thus, the substrate is warped, so that breaking of the conductor circuit, breaking of wiring, contact failure at the via hole or peeling of filled metal occurs thereby causing drops in electric connectivity and reliability.

However according to the present invention, after the plural single side circuit boards overlaid in the same direction and the copper foil are integrated by heat press, a conductor circuit is formed by etching the copper foil and other single side circuit board is placed on that conductor circuit forming face in an opposite direction to the aforementioned direction and integrated by heat press.

In this case, the mat face of the copper foil is pressed against the face on the conductive bump side of the single side circuit board located inside and the conductor circuit is formed by etching the copper foil. This conductor circuit can be formed into a desired wiring pattern having at least conductive pad to be joined with the conductive bump on the other single side circuit board to be overlaid.

Therefore, peeling strength and pull strength of the conductor circuit to the face on the conductive bump side of the substrate are secured sufficiently and deflection in position of the conductor pad to the via hole by heat press can be prevented thereby securing electric connection.

In this case, the heat press is preferred to be carried out twice. Although an accurate scale factor is needed, a high peeling strength and pull strength can be obtained.

It is permissible to form protective film of at least one kind selected from tin, zinc, nickel, and phosphorous or protective film of precious metal such as gold or platinum to the mat face of the copper foil which forms the conductor circuit.

The thickness of the protective film is preferred to be in a range of 0.01-3 µm. The reason is that if it is less than 0.01 µm, fine unevenness of the mat face cannot be covered completely and if it exceeds 3 µm, the protective film is loaded in the concave portions in the formed mat face, thereby mat treatment effect being killed. Particularly preferably, the thickness of the film is in a range of 0.03-1 µm.

Of the protective films, protective film made of tin is formed as thin film deposited by electroless displacement plating and because its adhesion property with the mat face is excellent, it can be applied most effectively.

For the electroless plating bathing for forming such tin contained plating film, tin boronfluoride—thiourea solution or tin chloride—thiourea solution is used and preferable plating condition is about five minutes at room temperature around 20° C., and about 1 minutes at high temperatures of 50° C. to 60° C.

According to such electroless plating treatment, copper-tin displacement reaction based on formation of metal complex of thiourea occurs on the surface of copper pattern so that thin tin film is formed. Due to copper-tin displacement reaction, the mat face can be covered without damaging the uneven configuration.

Precious metal which can be used instead of tin or the like is preferred to be gold or platinum. The reason is that such precious metal is harder to be attacked by acid or oxidant as roughing treatment solution than copper and it can cover the mat face easily. However, because the precious metal boosts its cost, it is often used for only high value added products. Film of gold or platinum can be formed by spattering, electrolytic plating or electroless plating.

Provision of such covering layer equalizes the wettability of the mat face so that not only connectivity with the conductive bump formed corresponding to the via hole can be improved but also connectivity with resin impregnated in core material constituting the resin insulating layer can be improved. As a result, the electric connectivity and connection reliability are improved largely.

The multi-layer printed wiring board formed by overlaying and heat press can be provided with solder resist layer covering the surface of a circuit board outside.

The solder resist layer is formed of mainly thermal setting resin or photo sensitive resin and an opening is formed at a portion corresponding to the via hole position on the circuit board and soldered bodies such as a soldered bump, soldering ball, T-shaped conductive pin are formed as an external terminal on the conductive circuit (conductive pad) exposed from that opening. The external terminals are formed on both faces.

Of the circuit boards located outside, other circuit board on a lower layer on a side connected to a mother board can be provided with a T-shaped conductive pin formed of metallic material such as 42 alloy, phosphor bronze or a conductive ball formed of metallic material such as gold, silver, solder, located just above the via hole.

BRIEF DESCRIPTION OF THE DRAWINGS

FIG. 3 is a manufacturing process diagram of a single side circuit board constituting the multi-layer printed wiring board shown in FIG. 1;

FIG. 4 is a manufacturing process diagram of a single side circuit board constituting the multi-layer printed wiring board shown in FIG. 1;

FIG. 5 is a manufacturing process diagram of a single side circuit board constituting the multi-layer printed wiring board shown in FIG. 1;

FIG. 6 is a manufacturing process diagram of a single side circuit board constituting the multi-layer printed wiring board shown in FIG. 1;

FIG. 7 is a manufacturing process diagram of the multi-layer printed wiring board shown in FIG. 1;

FIG. 8 is a manufacturing process diagram of the multi-layer printed wiring board shown in FIG. 1;

FIG. 9 is a manufacturing process diagram of the multi-layer printed wiring board according to a first modification of the first embodiment;

FIG. 10 is a manufacturing process diagram of the multi-layer printed wiring board according to a second modification of the first embodiment;

FIG. 11(A) is a sectional view of the multi-layer printed wiring board according to a modification of the first embodiment and FIG. 11(B) is a plan view;

FIG. 14(A) is a sectional view showing a via hole according to a change 1 of a example 1, FIG. 14(B) is a sectional view showing a via hole according to a change 2 of the example 1 and FIG. 14(C) is a sectional view showing a via hole according to a change 3 of the example 1;

FIGS. 15(A), (B), (C) are explanatory diagrams of the multi-layer printed wiring board according to a conventional technology;

FIG. 16 is a diagram comparing results of conduction test between the example 1 and comparative examples 1, 2;

FIG. 17(A) is a sectional view showing the structure of the multi-layer printed wiring board according to a second embodiment of the present invention, and FIG. 17(B) is a sectional view showing a condition in which the IC chip is loaded on the multi-layer printed wiring board;

FIG. 18(A) is a sectional view showing a condition in which the IC chip 70 of the multi-layer printed wiring board shown in FIG. 17(A) is molded with resin and FIG. 18(B) is a sectional view showing a condition in which the IC module is loaded on the multi-layer printed wiring board shown in FIG. 18(A);

FIG. 19(A) is a plan view of the multi-layer printed wiring board shown in FIG. 9(C) and FIG. 19(B) is a plan view of the multi-layer printed wiring board shown in FIG. 17(B);

FIG. 20(A) is a plan view of the multi-layer printed wiring board shown in FIG. 18(A) and FIG. 20(B) is a plan view of the multi-layer printed wiring board according to a modification of the second embodiment;

FIG. 22(A) is a plan view of the multi-layer printed wiring board of FIG. 21(A) and FIG. 22(B) is a plan view of the multi-layer printed wiring board of FIG. 21(B);

FIG. 23 is a diagram comparing results of conduction test between the example 2 and the comparative examples 3, 4; and FIG. 24(A) is a plan view of the multi-layer printed wiring board according to the conventional technology and FIG. 24(B) is a sectional view of the multi-layer printed wiring board of FIG. 24(A).

BEST MODE FOR CARRYING OUT THE INVENTION

Embodiments

First, the structure of the multi-layer printed wiring board in which the single side circuit boards are multi-layered according to the first embodiment of the present invention will be described with reference to FIGS. 1, 2.

Figure 1:
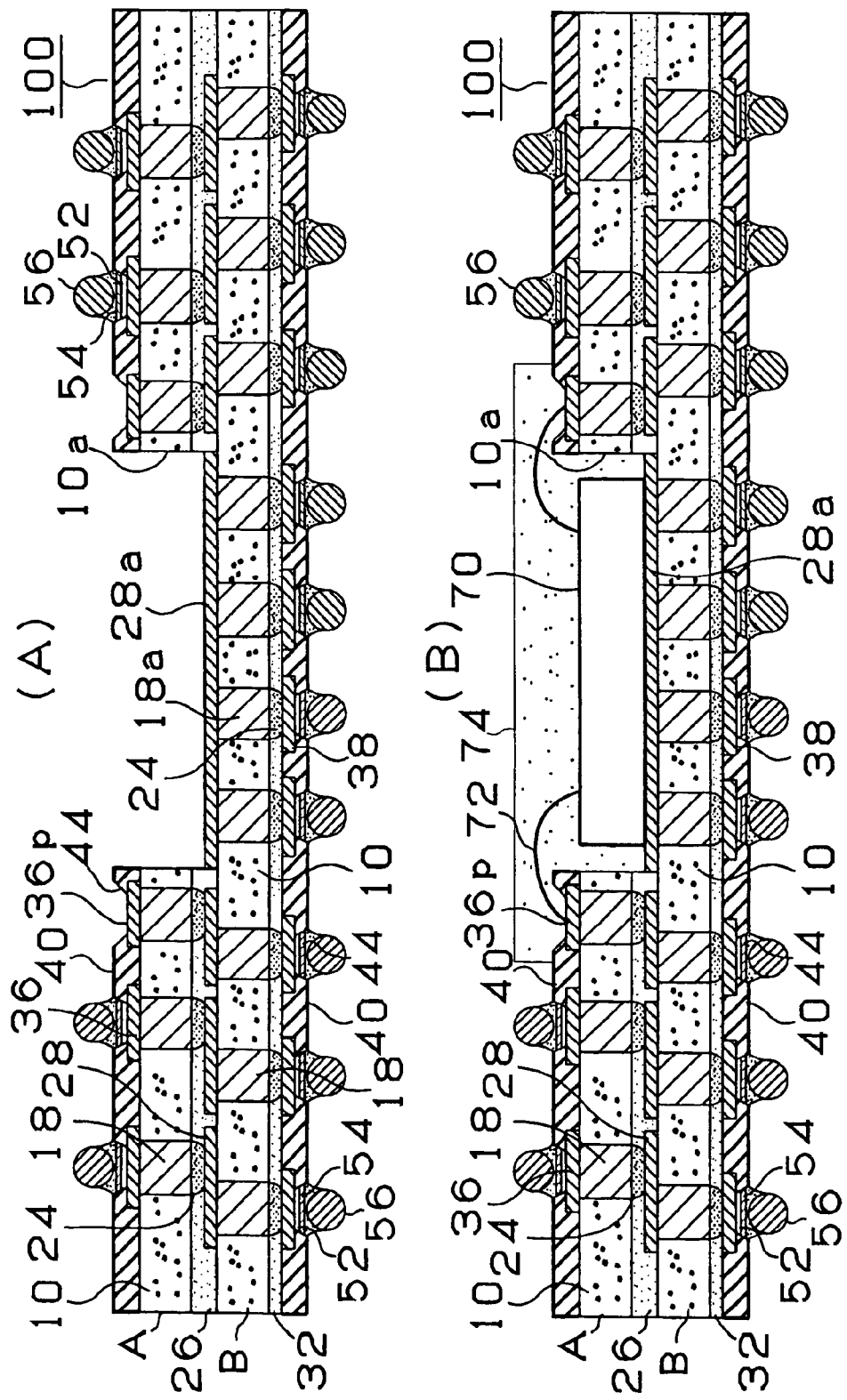
FIG. 1(A) is a sectional view of a multi-layer printed wiring board according to a first embodiment of the present invention and FIG. 1(B) is a sectional view showing a condition in which an IC chip is mounted on the multi-layer printed wiring board.

FIG. 1 shows the structure of the multi-layer printed wiring board 100 constituting a package substrate and FIG. 1(B) shows a condition in which an IC chip 70 is mounted on the multi-layer printed wiring board 100. FIG. 2 shows a condition in which an IC module 120 is mounted on the multi-layer printed wiring board 100 loaded with the IC chip 70.

As shown in FIG. 1(A), the multi-layer printed wiring board 100 is produced by stacking a single side circuit board A of two layers and a single side circuit board B. An opening (bored portion) 10a for accommodating the IC chip is formed in the center of the upper single side circuit board A. A conductor circuit 36 is formed on the top face of the single side circuit board A and a BGA 56 for connecting the IC module is disposed on the conductor circuit 36. A via hole 18 is formed in an opening 16 going through an insulating base material 10 below the conductor circuit 36. At a bottom end of the via hole 18 is disposed a soldered bump 24 for connecting to the conductor circuit 28 of the lower single side circuit board B. The single side circuit board A and the lower single side circuit board B are connected through adhesive agent layer 26. Metallic layer 28a for radiating heat of the IC chip 70 is provided in the center of the top face of the lower single side circuit board B. A via hole 18a for heat radiation is provided below the metallic layer 28a. The via hole 18 for connecting the circuit is provided below the upper conductor circuit 28 of the lower single side circuit board B. A conductor circuit 38 is connected to the soldered bump 24 of the lower single side circuit board B and the BGA 56 is mounted on the conductor circuit 38. In the meantime, the top face of the single side circuit board A and the bottom face of the single side circuit board B are covered with solder resist layer 40.

As shown in FIG. 1(B), the IC chip 70 is accommodated in the opening 10a of the multi-layer printed wiring board 100 and on the metallic layer 28a. The IC chip 70 is connected to a conductor circuit (pad) 36p on the side of the multi-layer printed wiring board through wire 72. The IC chip 70 and opening 10a are molded by resin 74.

Figure 2:
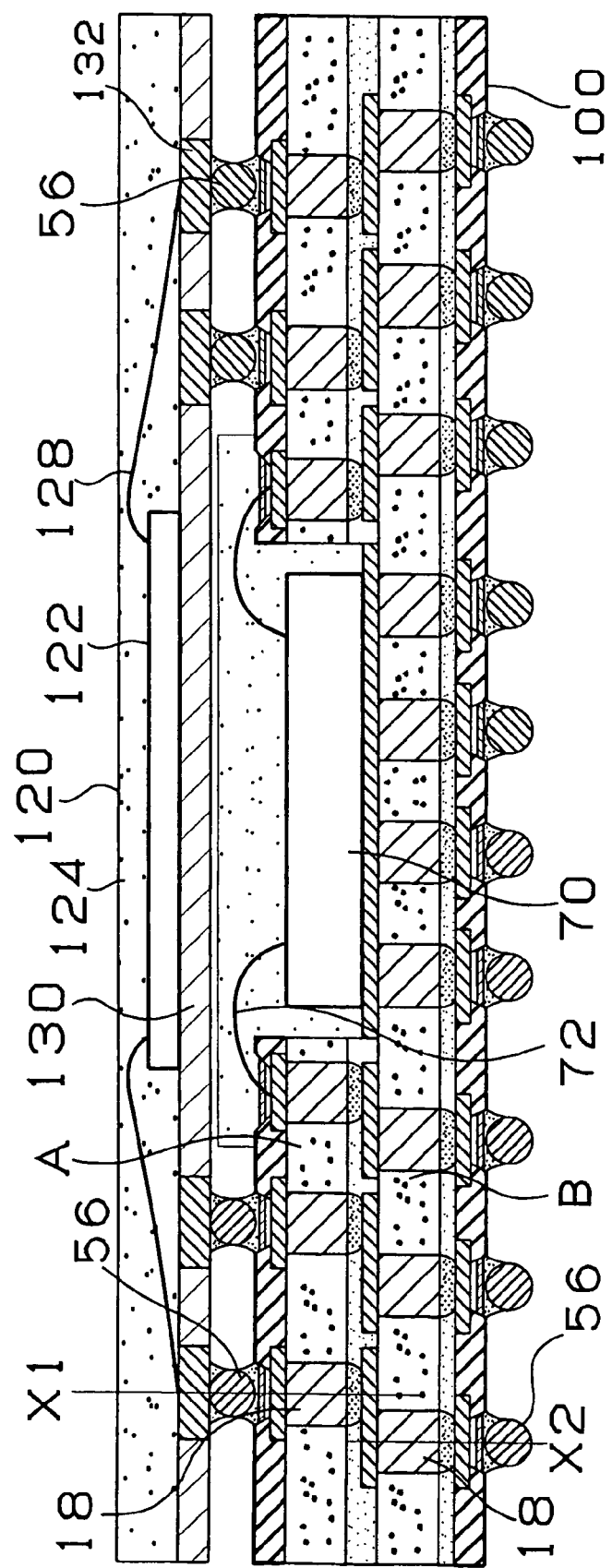
FIG. 2 is a sectional view showing a condition in which the IC module is mounted on the multi-layer printed wiring board shown in FIG. 1(B)

As shown in FIG. 2, an IC module 120 is connected to the BGA 56 on the front face side of the multi-layer printed wiring board 100 through a terminal 132. On the other hand, the BGA 56 on the back side of the multi-layer printed wiring board is connected to a printed wiring board or the like (not shown). The IC module 120 molds the IC chip 122 mounted on a terminal plate 130 with resin 124 and the IC chip 122 and the terminal 132 of the terminal plate 130 are bonding-connected through wire 128.

Because the BGAs 56 are disposed on the front face and rear face of the multi-layer printed wiring board 100 of the first embodiment, another printed wiring borad can be connected to each of the both surfaces. For example, with the IC module 120 mounted through the BGA 56 on the front face, the printed wiring board can be connected through the BGA 56 on the rear face. Further, freedom in the configuration of the IC module to be mounted increases.

If looking in another way, as a circuit formed on the multi-layer printed wiring board, two kinds of circuits, a circuit (PGK circuit) introduced outside by connecting to the IC chip 70 mounted on the substrate and a circuit (interposer circuit) introduced outside through the multi-layer printed wiring board connected to the IC module 120 are mixed. This can take roles of the interposer and PKG substrate with a single piece thereby achieving reduction in size and intensification of function. In this case, if a trouble occurs in the multi-layer printed wiring board 100 or the IC module 120, this can be treated before mounting the IC module 120 on the multi-layer printed wiring board. Even if the IC module 120 is redesigned (for example, in case of memory, means a case where its capacity is changed or the like), this board can meet it easily.

Because the bored portion 10a is formed, the thickness of the mounting area (thickness in a condition with the IC chip 70 mounted on the multi-layer printed wiring board 100) can be reduced. Further, even if the IC is constructed in multi-layers, the total thickness of the substrate including sealing resin can be reduced.

Figure 13:
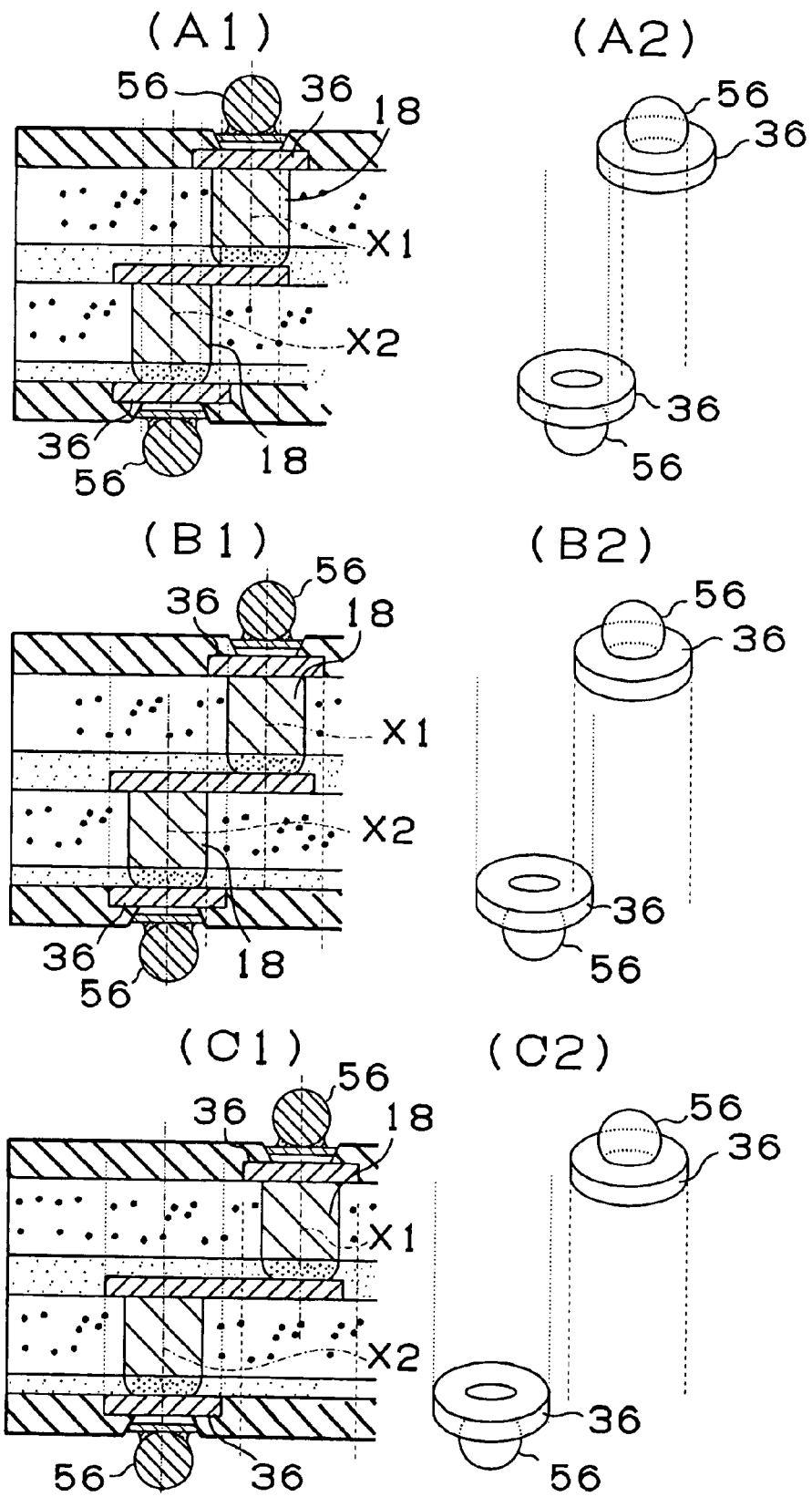
FIGS. 13(A1), (B1), (C1) show the external terminal in FIG. 2 in enlargement and FIGS. 13(A2), (B2), (C2) are perspective views of the external terminals in (A1), (B1), (C1)

According to the first embodiment, the BGAs 56 on the rear face are disposed just below the BGAs 56 and the pad 36p on the front face such that they do not overlap. As shown in FIG. 13 indicating part of FIG. 2 by enlargement, a center line X1 of a via hole 18 on which the BGA 56 is to be mounted is deflected from a center line X2 of a via hole 18 on which the BGA on the rear face is to be mounted. That is, the BGAs 56 on the rear face are disposed just below a connection area of the BGAs 56 and the pad on the front face such that the connection area of the BGAs 56 on the rear face does not overlap. The BGA 56 has a smaller connection portion than an external terminal such as conductive connecting pin, so that stress is likely to be concentrated. The reason is that if the thermal expansion coefficient of material is different from other printed wiring board, stress is generated due to an external factor such as application of heat and that stress is transmitted to an outer end. Thus, the generated stress is transmitted to a substrate. If the BGAs 56 on both sides are formed such that they overlap, stress is transmitted to the opposite side. Consequently, connection failure may occur on the opposite side. However, if the BGAs 56 do not overlap, the stress is relaxed thereby making connection failure difficult to induce.

According to the first embodiment, the IC chip 122 is a memory having a small heat release value and the IC chip 70 is a logic IC having a large heat release value. The metallic layer 28a is provided just under this IC chip 70 so that the metallic layer 28a is connected to the BGA 56 through the via hole 18a. With this configuration, heat is transmitted effectively to the printed wiring board side connected to the BGAs 56 and radiated.

FIG. 11(A) is a sectional view of the multi-layer printed wiring board according to a modification of the first embodiment and FIG. 11(B) is a plan view. According to this modification, the pads 36p are disposed in staggered fashion.

Figure 12:
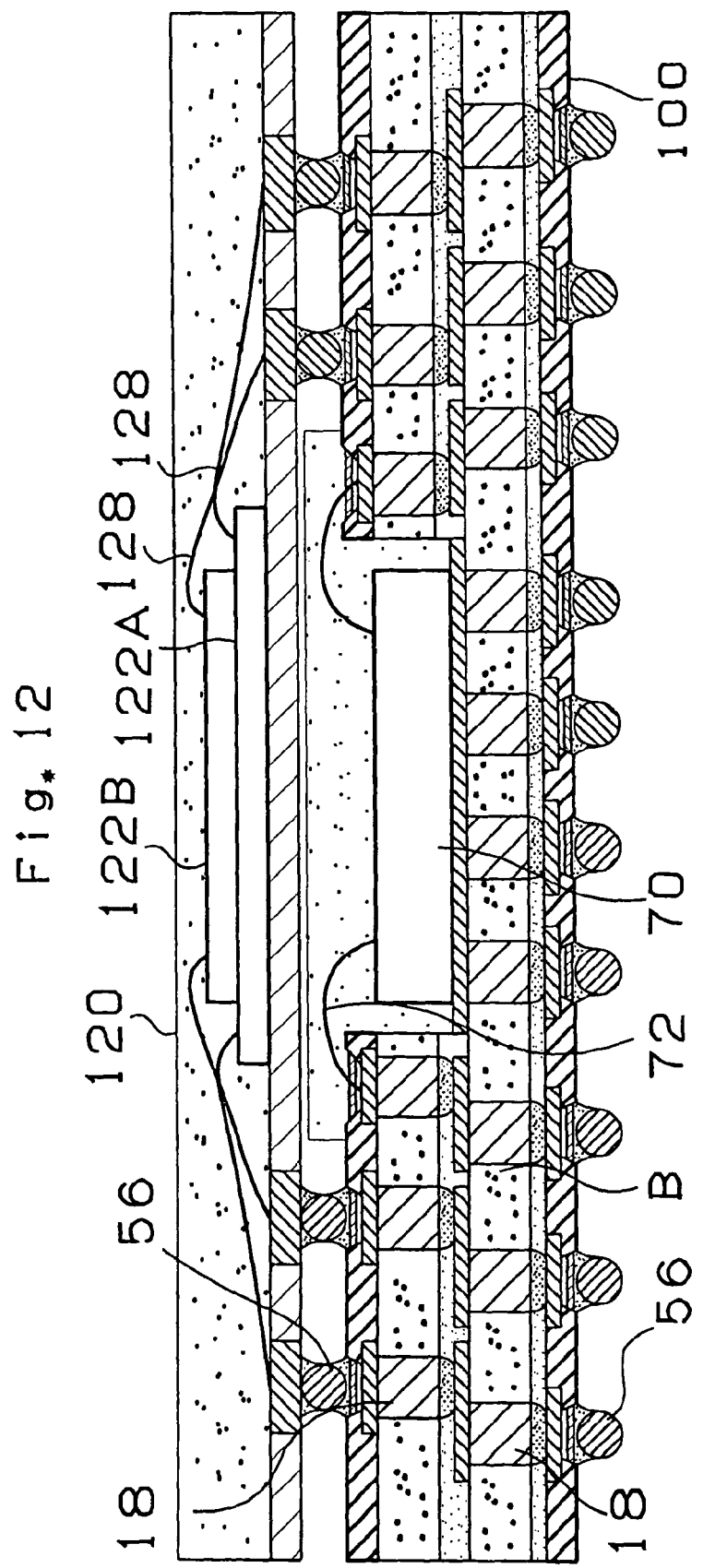
FIG. 12 is a sectional view of the multi-layer printed wiring board according to a modification of the first embodiment.

FIG. 12 is a sectional view of the multi-layer printed wiring board according to a modification of the first embodiment. As this modification indicates, the IC chips 122B can be stacked on the IC chip 122A.

Hereinafter, an example of the manufacturing method of the multi-layer printed wiring board of the first embodiment will be described in detail with reference to the accompanying drawings.

(1) Upon manufacturing the multi-layer printed wiring board of the present invention, the single side circuit board 10A which is a basic unit constituting it is a starting material in which copper foil 12 is bonded on a single side of the insulating base material 10 (FIG. 3(A)).

Although as this insulating base material, a hard layered base material selected from for example, glass fabric epoxy resin base material, glass fabric bismaleimide-triazine resin base material, glass fabric polyphenylene ether resin base material, aramid unwoven fabric—epoxy resin base material, aramid unwoven fabric—polyimide resin base material may be used, the glass fabric epoxy resin base material is most preferable. Inorganic fillers such as glass, alumina and zirconia may be dispersed in the resin of the insulating base material.

The insulating base material 10 is preferred to be 20-600 μm thick. The reason is that if the thickness is less than 20 μm, its strength drops so that it is difficult to handle and reliability on electric insulation lowers and if the thickness exceeds 600 μm, it is difficult to form a fine via hole and charge with conductive paste and the board itself becomes thick.

The thickness of the copper foil 12 is preferred to be 5-18 μm. The reason is that when an opening for via hole formation is made in the insulating base material by laser processing, if the base material is too thin, it is bored through and conversely if it is too thick, a conductor circuit pattern having a fine wire width is difficult to form by etching.

As for the insulating base material 10 and the copper foil 12, it is preferable to use a single side copper stretched layered board obtained by laying prepreg as B stage obtained by impregnating glass cloth with epoxy resin and copper foil and then pressing with heat. The reason is that during handling after etching of the copper foil, the positions of the wiring pattern and via hole do not deflect thereby ensuring an excellent position accuracy.

(2) Next, transparent protective film 14 is bonded to the surface on an opposite side to the surface on which the copper foil as the insulating base material is bonded (FIG. 3(B)).

As this protective film 14, polyethylene terephthalate (PET) film whose adhesive agent layer is 1-20 μm thick while its own thickness is 10-50 μm is used.

(3) Next, by irradiating the PET film 14 bonded on the insulating base material with carbon dioxide laser, the opening 16, which goes through the PET film from the front face of the insulating base material 10 to the copper foil (or conductor circuit pattern) 12 is formed (FIG. 3(C)).

This laser processing is carried out with a pulse oscillation type carbon dioxide laser processing unit and as the processing condition, preferably, pulse energy is 0.5 to 100 mJ, pulse width is 1 to 100% s, pulse interval is 0.5 ms or more and the number of shots is in a range of 3 to 50.

The diameter of the via forming opening 16 formed under such a condition is preferred to be 5 to 250 μm.

If the soldered bump described later is formed by printing with conductive paste, the protective film can be used as a print mask. In this case, it is preferable to use solder mixed with Cu, Zn or Sb. Because they have a high melting point as compared with Sn/Pb and the fluidity of its paste is small, short-circuit (short-circuit) with another adjoining conductor circuit is unlikely to occur. As a result, the electric connectivity and connection reliability are improved. However, it is permissible to use generally used paste such as Sn/Pb, Sn/Ag and conductive paste composed of metallic particles such as copper and gold.

(4) To remove resin residue collected on the side face and bottom face of the opening 16 formed in the step (3), de-smear treatment is carried out.

Preferably, this de-smear treatment is carried out by dry treatment such as oxygen plasma discharge treatment, corona discharge treatment, ultraviolet laser treatment or excimer laser.

(5) Next, after the PET film 15 is bonded to the surface of the copper foil 12 of the de-smeared substrate 10 as plate protective film (FIG. 3(D)), electrolytic copper plating treatment is carried out with the copper foil 12 as plating lead to fill the opening with electrolytic copper plating in order to form a filled via hole 18 (FIG. 3(E)).

After electrolytic copper plating treatment, it is permissible to release the PET film 15 bonded to the substrate and remove the electrolytic copper plating swollen on the top of the opening by belt sander polishing or buffing to flatten (FIG. 4(A)).

(6) After the electrolytic copper plating treatment of the (5), electrolytic soldering is carried out with the copper plating 18 as plating lead. By plating, projecting conductor made of electrolytic solder plating, that is, conductive bump 24 is formed such that it projects slightly from the surface of the electrolytic copper plating 18 (FIG. 4(B)). The conductive bump formed at this time is formed of Sn/Cu (97:3).

(7) After the adhesive agent layer 26 is formed by coating the surface of the insulating base material 10 containing the conductive bump 24 with resin adhesive agent, the PET film bonded on the copper foil 12 of the insulating base material 10 is released (FIG. 4(C)).

The resin adhesive agent is applied on the entire surface of the insulating base material containing the conductive bump or the surface containing no conductive bump to form adhesive agent layer composed of dried uncured resin. This adhesive agent layer is preferred to be pre-cured to facilitate its handling and its thickness is preferred to be in a range of 5 to 50 μm.

The adhesive agent layer is preferred to be formed of organic adhesive agent and the organic adhesive agent is preferred to be at least one resin selected from epoxy resin, polyimide resin, thermosetting polyphenolene ether (PPE), composite resin of epoxy resin and thermoplastic resin, composite resin of epoxy resin and silicone resin and BT resin.

Coating with the uncured resin which is organic adhesive agent can be carried out using a curtain coater, spin coater, roll coater, spray coater, screen printing or the like. Further, formation of the adhesive agent can be carried out by laminating with adhesive agent sheet.

At this time, two kinds of the single side circuit boards are created. One of them is a single side circuit board (hereinafter referred to as single side circuit board A) having the opening 10a in the substrate, created with a router or by punching (FIG. 4(D)).

Another is a single side circuit board (hereinafter referred to as single side circuit board B) having no opening, described later.

The single side circuit board A produced through the steps (1)-(7) has an opening in the substrate, created with router, punching, laser or the like. Its formation area is more than 3% the area of the IC chip mounted. The reason is that because if it is less than 2%, an allowance to unavoidable deflection in position of alignment of the IC chip or the like is eliminated, the IC chip cannot be mounted. Another reason is that there is secured no area for mounting.

When forming the multi-layer printed wiring board of the present invention in which the copper foil is provided as conductive layer on one surface of the insulating base material, a filled via hole is provided in an opening which reaches the copper foil from the other surface, soldered bump is formed of solder plating on that filled via hole and adhesive agent layer is formed on the surface of the insulating base material containing the soldered bumps, this is preferred to be employed as a circuit board located on an upper layer and to be overlaid or a circuit board which forms a double side circuit board together with the copper foil having a mat face.

Next, another single side circuit board B intended to be laid under the single side circuit board A is produced.

(8) First, after the same processing as the steps (1)-(6) is carried out (FIG. 5(A)-(G)), etching protective film 25 is bonded to the soldered bump 24 forming face of the insulating base material 10 (FIG. 6(A)) and the copper foil 12 is covered with a predetermined circuit pattern mask. Then, by etching, the conductive layer 28a which functions a heat radiating plate is formed just below the conductive circuit (including via land) 28 and the IC chip (FIG. 6(B)).

In this treatment process, after photosensitive dry film resist is bonded to the surface of the copper foil, it is exposed to light following a predetermined circuit pattern and developed to form etching resist. By etching metallic layer of a portion in which no etching resist is formed, a conductive circuit pattern including the via land is formed.

As this etching solution, it is preferable to use at least one selected from solutions including sulfuric acid—hydrogen peroxide, persulfate, cupric chloride, ferric chloride.

As pretreatment for forming the conductive circuit 28 by etching the copper foil, it is permissible to etch the entire surface of the copper foil so that preferably, the thickness thereof is 1-10 μm and more preferably, 2-8 μm, in order to facilitate formation of a fine pattern.

Although the inside diameter of via land as part of the conductive circuit is substantially the same as the diameter of the via hole and its outside diameter is preferred to be in a range of 50-250 μm.

(9) It is permissible to form thin film 29 of tin or the like on the surface of the conductor circuit formed in the (8) by electroless deposition (FIG. 6(C)).

For electroless deposition bathing to form tin contained plating film, tin borofluoride—thiourea solution or tin chloride—thiourea solution is used and a preferred plating condition is that the plating is carried out for 1-5 minutes at temperatures of 20° C.-60° C.

According to the electroless plating treatment, copper-tin displacement reaction based on the metal complex formation of thiourea occurs on the surface of the copper pattern and tin thin film layer is formed in thickness of 0.01-1 μm.

Roughing treatment is carried out to the surface of the conductor circuit 28 formed in the step (7) as required and tin layer formed in the step (8) can be formed on that roughed layer.

Further, instead of tin layer, it is preferable to cover with protective film composed of at least one kind selected from zinc, nickel and phosphor or protective film composed of precious metal such as gold, platinum.

The purpose of the roughing treatment is to improve adhesion with the adhesive agent layer upon constructing into multi-layers to prevent delamination (delamination).

As the roughing treatment method, for example, soft etching treatment, blacking (oxidation)—reduction treatment, formation of needle-like alloy plating of copper-nickel-phosphorus (made by EBARA YUJIRAITO; product name, INTERPLATE) and surface roughing with etching solution named "MEC ETCH BOND" made by MEC are available.

The aforementioned roughed layer is preferred to be formed with etching solution and can be formed by etching the surface of a conductor circuit using mixture water solution of cupric complex and organic acid. Such etching solution is capable of dissolving a copper conductor circuit pattern under oxygen existing condition such as spray, bubbling and it is estimated that the reaction is advanced as follows.

$$Cu+Cu(II)A_n \rightarrow 2Cu(I)A_{n/2}$$

$$2Cu(I)A_{n/2}+n/4O_2+nAH(\text{aeration}) \rightarrow 2Cu(II)A_n+n/2H_2O$$

where A designates complexing agent (acts as chelating agent), n designates coordination number.

As indicated in the above equation, generated cuprous complex dissolves by the action of acid and combines with oxygen to turn to cupric complex, thereby contributing to oxidation of copper. As the cupric complex used in the present invention, azoled cupric complex is recommended. The etching solution composed of organic acid—cupric complex can be controlled by dissolving the azoled cupric complex and organic acid (halogen ion as required) into water.

Such etching solution is formed of water solution in which for example, 10 weight parts of imidazoled copper (II) complex, 7 weight parts of glycol acid and 5 weight parts of potassium chloride.

Further, the single side circuit board B may be formed without roughing treatment or formation of a covering layer.

(10) After releasing the protective film 25 from the surface of the insulating base material 10 containing soldered bump, the surface of the insulating base material is coated with the resin adhesive agent 32 (FIG. 6(D)).

The resin adhesive agent is applied to the entire surface containing soldered bump of the insulating base material or the surface containing no soldered bump, so that adhesive agent layer composed of dried uncured resin is formed. This adhesive agent layer is desired to be pre-cured to facilitate its handling and its thickness is desired to be in a range of 5-50 μm.

The adhesive agent layer is preferred to be composed of organic adhesive agent and the organic adhesive agent is preferred to be at least one resin selected from epoxy resin, polyimide resin, thermosetting polyphenolene ether (PPE), composite resin of epoxy resin and thermoplastic resin, composite resin of epoxy resin and silicone resin and BT resin.

Coating with the uncured resin which is organic adhesive agent can be carried out using a curtain coater, spin coater, roll coater, spray coater, screen printing or the like. Further, formation of the adhesive agent can be carried out by laminating with adhesive agent sheet.

The single side circuit board B manufactured through the step (8)-(10) possesses a conductor circuit on a surface of the insulating base material 10 and the soldered bump 24 composed of solder plating on the other surface and further, the adhesive agent layer 26 for bonding to other insulating base material or the adhesive agent layer 32 for bonding to the copper foil is formed on the surface of the insulating base material containing the soldered bump 24.

(11) With the face on the conductive bump side of the single side circuit board A facing downward, the single side circuit board B is laid on that face in the same direction. The copper foil 30 5-18 μm thick having a mat face having a surface roughness of 1.0 μm is laid on the surface on the soldered bump 24 side of the single side circuit board B (FIG. 7(A)) and pressed with heat at heating temperature of 150-200 μC and under an applied pressure of 1-10 MPa so as to integrate the single side circuit board A with the single side circuit board B (FIG. 7(B)).

At this time, metal or resin film is nipped between the opening 10a in the single side circuit board A and a pressing plate. This is effective for preventing adhesive agent from flowing out and avoiding deflection in position and unevenness in pressure at the time of pressing. In this case, it is permissible to put nothing or only place a pressure equalizing plate having a convex portion.

Preferably, such pressing with heat is carried out under a reduced atmospheric pressure and the uncured resin adhesive agent layer 26 is hardened so that the single side circuit board A and the single side circuit board B are bonded together. By hardening the adhesive agent layer 32, the copper foil 30 is bonded.

(12) By etching the upper copper foil 12 and the lower copper foil 30 of the circuit boards integrated in the (11), the conductor circuit 36 and the conductor circuit 38 (including the via hole land and pad 36p) are formed in the upper layer and the lower layer of the multi-layer printed wiring board (see FIG. 7(C)).

In this treatment process, first, photosensitive dry film resist is bonded to the surface of the copper foil 12 and the copper foil 30 and after that, exposed to light following a predetermined circuit pattern and developed to form etching resist. By etching metallic layer at a portion in which no etching resist is formed, the conductor circuit 36 and the conductor circuit 38 containing the via hole land are formed.

(13) Next, the solder resist layer 40 is formed on the outer sides of the single side circuit boards A, B (FIG. 8(A)). In this case, solder resist composition is applied to the entire outer surface of each of the circuit boards A, B and after drying that applied film, a photo mask film on which an opening is drawn is placed on this applied film and exposed to light and developed to form the opening 44 which exposes the soldered pad portion located just above the conductor circuit and via hole. Otherwise, it is permissible to bond a film, expose to light and develop or make an opening with laser.

(14) Before disposing a conductive bump, conductive ball or conductive pin, which is an external terminal, on a soldered pad (opening 44) exposed just above the via hole from an opening in the solder resist obtained in the step (13), preferably, a metallic layer composed of nickel 52—gold 54 is formed on each soldered pad (FIG. 8(B)).

This nickel layer 52 is preferred to be 1-7 μm thick and the metallic layer 54 is preferred to be 0.01-0.06 μm. The reason is that if the nickel layer is too thick, resistance is increased and if it is too thin, the nickel layer is likely to separate. Another reason is that if the metal layer is too thick, production cost is increased and if it is too thin, adhesion effect with a soldered body drops. It is permissible to form a single layer of tin or precious metal.

(15) Solder body is supplied onto metallic layer composed of nickel-gold provided on the soldered pad portion so as to form conductive bump as an external terminal by melting/solidification of this solder body. Alternatively, conductive ball or conductive pin is joined with the soldered pad portion to form a multi-layer circuit board (FIG. 1(A)).

As a supply method for the solder body, it is permissible to use solder transfer method or print method. According to this solder transfer method, solder foil is bonded to a prepreg and by etching with this solder foil left only at a portion corresponding to an opening portion, a solder pattern is formed as a solder carrier film. After coating a solder resist opening portion of a substrate with flux, this solder carrier film is laid such that the solder pattern makes contact with the pad and by heating this, it is transferred.

On the other hand, according to the print method, with a print mask (metal mask) provided with an opening at a portion corresponding to the pad placed on a substrate, solder paste is printed and heat-treated. As solder, it is permissible to use tin-silver, tin-indium, tin-zinc, tin-bismuth, tin-antimony. Their melting points are preferred to be lower than the melting point of the conductive bump.

That is, appropriate solder body is supplied onto each solder pad exposing from an opening in the solder-resist layer to form the conductive bump or connect the conductive ball or the conductive T-pin.

As the solder material for connecting the conductive ball 56 or the T-pin, it is preferable to use tin/antimony solder, tin/silver solder, tin/silver/copper solder each having a higher melting point than the melting point of the conductive bump.

According to the embodiment following the steps (1)-(15), in the multi-layer printed wiring board 60, the single side circuit board A and the single side circuit board B are overlaid in the same direction and with the copper foil 30 disposed such that its mat face opposes the surface of the solder bump side of the single side circuit board B, pressed with heat to bond together the single side circuit boards while the copper foil 30 is pressed against the single side circuit board B, thereby forming the multi-layer structure. Then, by etching the copper foil 12 on the single side circuit board A and the copper foil 30 on the single side circuit board B2, the conductor circuits 36, 38 are formed. In addition to such an embodiment, it is permissible to adopt the manufacturing process described in (1) modification 1 or (2) modification 2, later.

(1) Modification 1

With the mat face of the copper foil 30 opposing the surface on the solder bump 24 side of the single side circuit board B (FIG. 9(A)), the copper foil 30 is contact-bonded to the single side circuit board B by vacuum heating press (FIG. 9(B)). After that, by etching with the etching protective film attached, the copper foil is etched selectively so as to form the conductor circuit 38 having a predetermined pattern, thereby forming the double side circuit board B (FIG. 9(C)).

After that, with the face on the conductor circuit 28 side of the circuit board B opposing the soldered bump 24 side of the single side circuit board A (FIG. 9(D)), they are pressed with heat under vacuum to form multi-layer structure (FIG. 9(E)). After that, by etching the copper foil of the single side circuit board A, a conductor circuit is formed (see FIG. 7(C)).

(2) Modification 2

By etching the copper foil 12 of the single side circuit board A shown in FIG. 4(C), the conductor circuit 36 is formed (FIG. 10(A)) and an opening 10*a* is made in the substrate 10 with a router or by punching (FIG. 10(B)). After that, with the double side circuit board B in which the conductor circuit 38 is formed in the step of FIG. 9(C), opposing the single side circuit board A (FIG. 10(C)), they are pressed with heat under vacuum to form the multi-layer structure (FIG. 10(D)).

Although according to the above-described embodiment, two layers are formed by integrating the two single side circuit boards, it is possible to form multi-layer structure having a necessary number of layers by increasing the quantity of the single side circuit boards even if it is three or more.

Example 1

(1) First, a single side circuit board constituting a multi-layer printed wiring board is produced. For this circuit board, a single side copper stretched layered board obtained by overlaying a prepreg as B stage in which epoxy resin is impregnated with glass cloth and copper foil and then pressing them with heat is used as a starting material. This insulating base material is 75 μm thick and the copper foil is 18 μm thick. The surface on an opposite side to the copper foil forming face of this layered board is laminated with PET film 12 μm thick and having adhesive agent layer 12 μm thick.

(2) Next, by irradiating the PET film with carbon dioxide laser, a via hole forming opening going through the PET film and insulating base material up to the copper foil is made and further it is permissible to de-smear the inside of the opening by oxygen plasma discharge or dipping in chemical solution of acid, oxidizing agent or alkali. By the de-smear treatment, the base material is smoothed and resin residue can be removed from the conductor portion, which is the copper foil. As a result, even if conductive filler is loaded, connectivity and reliability are secured. Although the resin residue causes any problem, no problem occurs because it is removed.

According to this embodiment, to form an opening for via hole formation, a high peak short pulse oscillation carbon dioxide laser processing machine made by MITSUBISHI ELECTROC was used. Glass cloth epoxy resin base material 60 μm thick whose resin face is laminated entirely with PET film 22 μm thick, is irradiated with laser beam from the PET film side according to mask imaging method to form openings for via hole formation 150 μm in diameter at a speed of 100 holes/second.

(3) With the PET film bonded to the copper foil face of the insulating base material after de-smear treatment, electrolytic copper plating with copper foil as plating lead was carried out to fill the opening with electrolytic copper plating to form a via hole. When the electrolytic copper plating is exposed slightly over the top of the opening, it is permissible to remove the exposed portion for flattening by sander belt polishing and buffing.

[Water Solution for Electrolytic Copper Plating]
sulfuric acid: 175 g/l
cupric sulfate: 78 g/l
additive (made by ATOTECH JAPAN, product name: KAPARASIDO GL)

[Electrolytic Plating Condition]
Current density: 6 A/dm$^2$
Time: 60 min.
Temperature: 25° C.

(4) Further, by executing electrolytic solder plating under a following condition, solder plating layer is formed on copper plating layer filled in the opening and soldered bump projecting by 3-10 μm form the surface of the insulating base material is formed.

[Electrolytic Solder Plating Solution]
Metal composition ratio: formed in a range of Sn/Cu=99.9/0.1-70/30
Additive: 5 ml/l (Electrolytic Solder Plating Condition)
Temperature: 21° C.
Current density: 0.41 A/dm$^2$
As its specific example, Sn/Cu=99.3/0.7 (melting point 227° C.), Sn/Cu=95/5 (melting point: 310)

In this case, formed soldered bump whose ratio was Sn/Cu=99.9/0.1-90/10 is taken as an optimum example and a case of Sn/Cu>90/10 was taken as an application example.

(5) Next, after the PET film bonded to the insulating base material in the (3) was released, the entire surface on the soldered bump side of the insulating base material was coated with epoxy resin adhesive agent and pre-cured to form adhesive agent layer for multi-layer structure.

(6) An opening was made in the insulating base material formed in the step (5) with router or by punching or laser. The area for the opening was 15-70%. According to this embodiment, the opening area was 36.5%.

The single side circuit board A produced in the steps (1)-(6) is a circuit board to be disposed as an upper layer upon constructing into a multi-layer structure, and the inside of the opening is an area in which the IC chip is mounted.

(7) After the same treatment as the steps (1)-(4) was carried out, the PET film was released from the copper foil bonding surface of the insulating base material and with the etching protective film bonded to the surface on the soldered bump side of the insulating base material, appropriate etching was carried out to the copper foil to form a conductor circuit having a predetermined pattern.

It is permissible to carry out electroless plating on the surface of the conductor circuit obtained in the step (7) using tin borofluoride—thiourea solution as electroless plating bath under a plating condition around 45° C. for about five minutes to form thin tin layer 0.1 μm thick.

(8) After the etching protective film bonded to the insulating base material was released in the step (6), epoxy resin adhesive agent was applied to the entire surface on the soldered bump side of the insulating base material and pre-cured to form adhesive agent layer for forming multi-layer structure by bonding together the circuit boards.

The single side circuit board A manufactured following the steps (6)-(8) is a board to be combined with the single side circuit board B.

(9) After the single side circuit board B on which the copper foil 30 having a mat face was subjected to the same treatment as the steps (1)-(5) and (7), epoxy resin adhesive agent was applied to bond the copper foil 30 having the mat face on the insulating base material 10 effectively instead of the adhesive agent of the step (8) and dried at 60° C. for 30 minutes to form a resin adhesive agent layer 20 μm thick.

(10) After the single side circuit board A produced following the steps (1)-(8) and the single side circuit board B produced following the step (9) were overlaid in the same direction, a copper foil 12 μm thick whose single side was subjected to mat processing, having a surface roughness of 1.0 μm was heat-pressed to the face on the soldered bump side of the single side circuit board B such that the mat face opposed, under a condition of heating temperature of 200° C., heating time of 10 minutes, pressure of 2 MPa, and degree of vacuum of 2.5×10$^3$ Pa, so that the respective single side circuit boards A, B were bonded together and then, the copper foil was bonded to the single side circuit board to form the multi-layer structure.

(11) After that, a conductor circuit (including via land) was formed on the copper foils of the single side circuit board A and single side circuit board B of the multi-layered board by appropriate etching treatment.

(12) Before forming solder-resist layer on the surface of the multi-layer board produced following the steps (1)-(11), it is permissible to provide a roughed layer of copper—nickel—phosphorus or a roughed face by etching as required.

(13) On the other hand, 46.67 weight part of oligomer (4,000 in molecular weight) provided with photo sensitivity in which the epoxy base 50% of 60 weight % cresol-novolac type epoxy resin (made by NIPPON KAYAKU) dissolved in DMDG was made acrylic, 14.121 weight part of 80 weight % bisphenol A type epoxy resin (made by YUKA SHELL, Epikote 1001) dissolved in methyl ethyl ketone, 1.6 weight part of imidazole hardening agent (made by SHIKOKU CORP., 2E4MZ-CN), 1.5 weight part of polyacryl monomer (made by NIPPON KAYAKU, R604), which is photo sensitive monomer, 30 weight part of polyacryl monomer (made KYOEISHA CHEMICAL, DPE6A), and 0.36 weight part of leveling agent (made by KYOEISHA, Polyflow No. 75) composed of acryl ester polymer were mixed and then, 20 weight part of benzophenone as photo initiator (KANTO CHEMICAL) and 0.2 weight part of EAB (made by HODOGAYA CHEMICAL) as photosensitizer were added to this mixture and further, 10 weight part of DMDG (di-ethylene glycol di-methyl ether) was added, so that solder resist composition whose viscosity was adjusted to 4±0.3 Pa·S at 25° C. was obtained.

As for measurement of the viscosity, if the B type viscosimeter (made by TOKYO KEIKI, DVL-B type) was 60 rpm, rotor No. 4 was used and if it was 6 rpm, rotor No. 3 was used.

(14) The solder resist composition obtained in the step (13) was applied to the surface of the multi-layer circuit board obtained in the step (11) in the thickness of 20 μm.

Next, after the drying treatment was carried out at 70° C. for 20 minutes and at 100° C. for 30 minutes, the side in which chrome layer was formed of a soda lime glass substrate 5 mm thick on which a circular pattern (mask pattern) of solder resist opening portion was drawn with chrome layer was fitted to the solder—resist layer and exposed to light with 1000 mJ/cm$^2$ ultraviolet ray and subjected to DMTG development treatment. Further, the heat treatment was carried out at 80° C. for an hour, at 100° C. for an hour, at 120° C. for an hour and at 150° C. for three hours to form solder-resist layer (20 μm thick) having an opening (200 μm in opening diameter) corresponding to a pad portion.

(15) Next, a substrate in which solder-resist layer was formed was dipped in electroless nickel plating solution having pH=5 composed of nickel chloride of 30 g/1, sodium hypophosphite of 10 g/1, sodium citrate of 10 g/1 for 20 minutes, so that nickel plating layer 5 μm thick was formed on the opening portion.

That substrate was dipped in electroless gold plating solution composed of gold potassium cyanide of 2 g/1, ammonium chloride of 75 g/1, sodium citrate of 50 g/1, and sodium hypophosphite of 10 g/1 at 93° C. for 23 seconds to form gold plating layer 0.03 μm thick on the nickel plating layer, so that covering metallic layer composed of nickel plating layer and gold plating layer was formed. Depending on a case, it is permissible to form a single layer of tin or precious metal.

(16) Then, solder paste composed of tin/silver solder having a melting point of about 190° C. was printed on solder pad exposed from an opening of solder resist layer covering the single side circuit board A located as an upper layer and by reflowing at 220° C., solder balls were connected on both sides to form a multi-layer printed wiring board.

[Modification 1 of Example 1]

Although the multi-layer printed wiring board of the modification 1 of the example 1 had the same structure as the example 1 (the via holes 18 were kept deflected between upper and lower single side boards and the BGA 56 was kept deflected from just below), the conductive bump was formed of Sn/Zn (97:3).

[Modification 2 of Example 1]

Although the multi-layer printed wiring board of the modification 2 of the example 1 had the same structure as the example 1, the conductive bump was formed of Sn/Sb (95:5).

[Modification 3 of Example 1]

Although the multi-layer printed wiring board of the modification 3 of the example 1 had the same structure as the example 1, the conductive bump was formed of Sn/Pb (97:3).

[Modification 4 of Example 1]

Although the multi-layer printed wiring board of the modification 4 of the example 1 had the same structure as the example 1, the conductive bump was formed of Sn/Ag (95:5).

[Change 1 of Example 1]

In the multi-layer printed wiring board of the change 1 of the example 1, its conductive bump was formed of Sn/Su (97:3). Different from the structure of the example 1, as shown in FIG. 14(A), the external terminal 56 was disposed on the rear face just below the external terminal 56 on the front face.

[Change 2 of Example 1]

In the mulit-layer printed wiring board of the change 1 of the example 1, its conductive bump was formed of Sn/Su (97:3). However, different from the structure of the example 1, as shown in FIG. 14(B), the via hole 18 in the upper single side circuit board was disposed just above the via hole 18 in the lower single side circuit board.

[Change 3 of Example 1]

In the multi-layer printed wiring board of the change 1 of the example 1, its conductive bump was formed of Sn/Su (97:3). Different from the structure of the example 1, as shown in FIG. 14(C), the external terminal 56 on the rear face was disposed just below the external terminal 56 on the front face and the via hole 18 in the upper single side circuit board was disposed just above the via hole 18 in the lower single side circuit board.

Comparative Example 1

As shown in FIG. 15(A), a multi-layer printed wiring board was formed of a single side circuit board according to the manufacturing method described in Japanese Patent Application Laid-Open No. HEI10-13028. FIG. 15(B) shows a condition in which the multi-layer printed wiring board shown in FIG. 15(A) is mounted on a daughter board 90. FIG. 15(C) shows a condition in which IC chips 70A, 70B are stacked. Here, the via holes 118 are constructed by filling non-through holes with conductive paste and the single side circuit boards are overlaid without use of any conductive bump. The via holes 118 are arranged such that they are stacked. A land 136 is formed by extending a conductor circuit connected to the via hole and a wire pad of the IC chip 70 is connected to the land 136 with wire 72.

Comparative Example 2

Although the multi-layer printed wiring board of the comparative example 2 has the same structure as the comparative example 1, the non-through holes are filled with plating instead of conductive paste.

[Comparison Test]

According to this example, a PKG substrate loaded with an IC chip was connected to the top face of the board and a multi-layer substrate produced according to subtractive method loaded with only electronic components such as capacitor was connected to the bottom face of the board.

According to the comparative example, an IC chip structured into multi-layer structure by stacking layers was loaded on the top face of the board and the side in which the BGA was disposed was connected to a multi-layer board (daughter board 90) produced according to the subtractive method loaded with only electronic components such as capacitor.

FIG. 16 shows whether or not the IC chip is checked about five pieces created according to the example 1 and the comparative examples 1, 2, whether or not repair is enabled (whether or not the IC chip was replaced), and result of conductivity test performed as reliability test (with three minutes at 135° C. to three minutes at −65° C. as a cycle under heat cycle condition, performed 500 cycles, 1000 cycles, 2000 cycles and 3000 cycles).

It was verified that electric connectivity and reliability were secured as compared with a conventional case (comparative example).

Upon comparison of the example 1, it was verified that a structure not adopting the stacked structure (disposing a via hole just above a via hole), in which an external terminal is deflected from just below an external terminal on an opposite face, was the most excellent in terms of electric connectivity and reliability. Contrary to this, an example adopting the stacked structure in which the external terminals was located at the same position deteriorated early. This was indicated to be of a structure in which generated stress was hard to relax.

Further, it was verified that an example in which Cu, Zn, Sb was mixed in its conductive bump had a higher reliability than other conductive metals.

Because the example 1 possesses a pad for connecting an external terminal on both faces of the multi-layer printed wiring board, other printed wiring board can be connected to the both faces. As a result, freedom of pulling out a wire is intensified and a structure which enables the IC chip to be multi-layered is obtained.

Further, by using the conductive bump, the reliability can be improved. Mixing of Cu, Zn and Sb can contribute to improvement of the reliability.

Because the via holes are not stacked and when external terminals are provided on both faces, the external terminal is not provided on an opposite face just below another external terminal, the reliability can be improved.

Second Embodiment

First, the structure of a multi-layer printed wiring board produced by overlaying the single side circuit boards, according to the second embodiment of the present invention will be described with reference to FIGS. 17, 18.

Figure 17A:
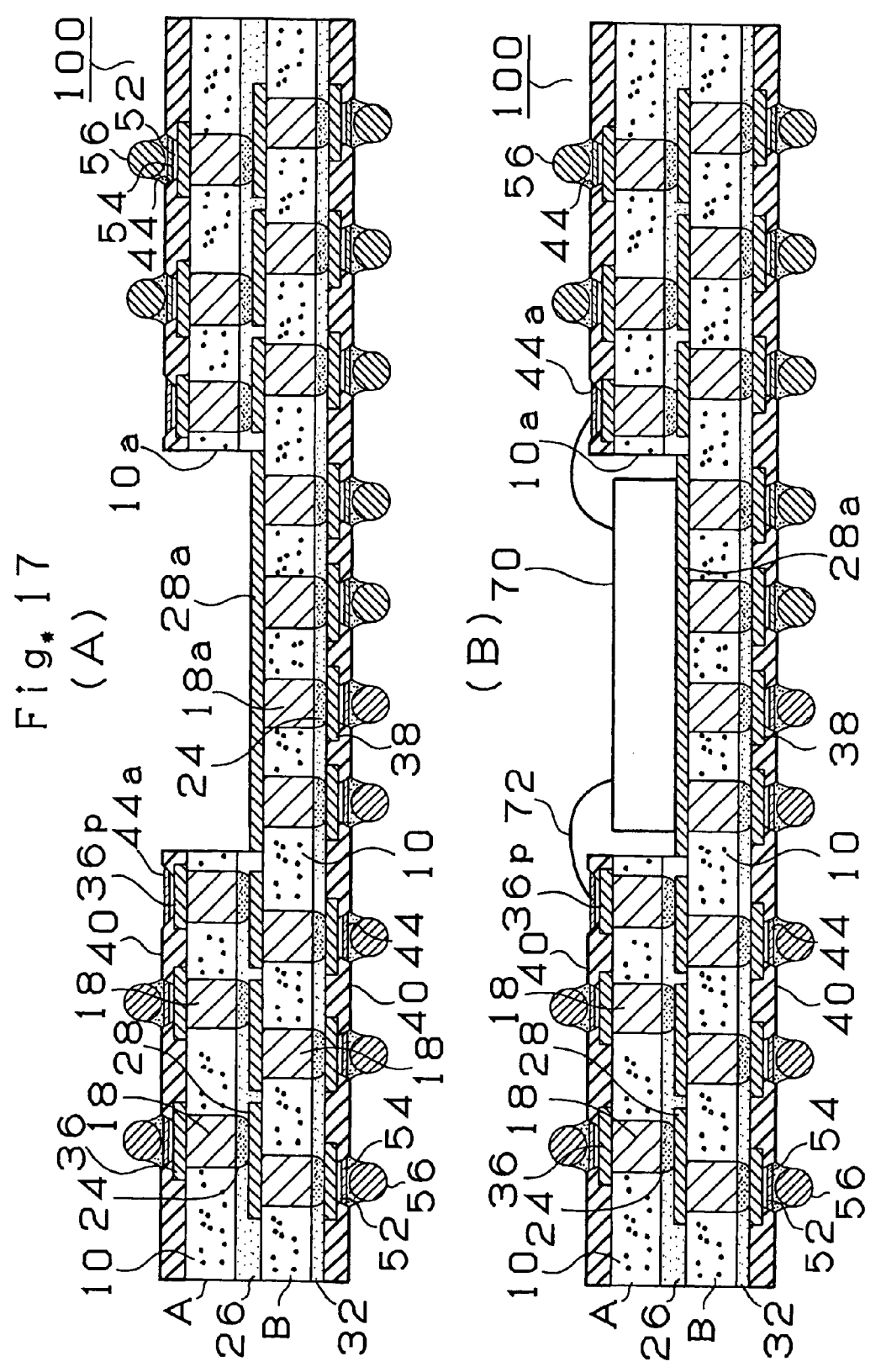

FIG. 17(A) shows a multi-layer printed wiring board 100 constituting a package board and FIG. 17(B) shows a condition in which the IC chip 70 is mounted on the multi-layer printed wiring board 100. FIG. 18(A) shows a condition in which the IC chip 70 of the multi-layer printed wiring board shown in FIG. 17(A) is molded with resin and FIG. 18(B) shows a condition in which the IC module 120 is mounted on the multi-layer printed wiring board 100 loaded with the IC chip 70.

As shown in FIG. 17(A), the multi-layer printed wiring board 100 comprises two layers, the single side circuit board A and the single side circuit board B. The top face of the single side circuit board A and the bottom face of the single side circuit board B are covered with solder resist layer 40. An opening (bored portion) 10a for accommodating an IC chip is formed in the center of the upper single side circuit board A. A conductor circuit 36 and bonding pad 36a are formed on the top face of the single side circuit board A. A BGA 56 for connecting to the IC module is disposed on an opening 44 in the solder resist layer 40 on the conductor circuit 36. Further, a via hole 18 is formed in an opening 16 going through an insulating base material 10 under the conductor circuit 36 and the bonding pad 36p. A soldered bump 24 for connecting to a conductor circuit 28 of the lower single side circuit board B is disposed on the bottom end of the via hole 18. The single side circuit board A and the lower single side circuit board B are connected through adhesive agent layer 26. A metallic layer 28a is provided in the center of the top face of the lower single side circuit board B to radiate heat of the IC chip 70. A heat radiating via hole 18a is provided below the metallic layer 28a. The via hole 18 for connecting a circuit is provided below the conductor circuit 28 on the top face of the lower single side circuit board B. A conductor circuit 38 is connected to the soldered bump 24 of the lower single side circuit board B and the BGA 56 is attached to the conductor circuit 38. FIG. 19(B) shows a plan view of FIG. 17(B) and FIG. 19(A) shows a condition before formation of the solder resist layer of the multi-layer printed wiring board shown in FIG. 17(B). As shown in FIG. 19(A), the conductor circuit 36 just above the via hole 18 is formed circularly and the bonding pad 36p connected directly to the via hole 18 is formed rectangular. As shown in FIG. 19(B), the bonding pad 36p is exposed partially through an elliptic opening 44a in the solder resist layer 40. Although according to the second embodiment, the opening 44a is formed elliptically, this shape may be circular, oval shape, polygonal, or a square which exposes front ends of all the bonding pads 36 as shown in FIG. 20(B).

An IC chip 70 is accommodated within the opening 10a in the multi-layer printed wiring board 100 and on the metallic layer 28a as shown in FIG. 17(B). The IC chip 70 is connected to the bonding pad 36p under the opening 44a in the solder resist layer 40 on the multi-layer printed wiring board side with wire 72. FIG. 20(A) shows a plan view of FIG. 17(B).

As shown in FIG. 18(A), the IC chip 70 and the opening 10a are molded with resin 74.

As shown in FIG. 18(B), the BGA 56 on the front face of the multi-layer printed wiring board 100 is connected to the IC module 120 through a terminal 132. On the other hand, the BGA 56 on the rear face of the multi-layer printed wiring board is connected to a printed wiring board or the like (not shown). In the IC module 120, an IC chip 122 placed on a terminal plate 130 is molded with resin 124 and the IC chip 122 and a terminal 132 of the terminal plate 130 are bonding-connected with a wire 128.

In the multi-layer printed wiring board 100 of the second embodiment, the bonding pad 36p is connected directly to the via hole 18 of conductive material filled in the non-through hole. That is, by filling the non-through hole leading to the conductor circuit (bonding pad) 36p with conductive material, different from the conventional technology described with reference to FIG. 24, the conductive material (via hole) and the conductor circuit (bonding pad) can be connected not through the via hole land because the conductive circuit (bonding pad) 36p is connected with the conductive material (via hole) 18. Because any via hole land having a diameter larger than the width of wire of bonding pad is not used, wiring density can be intensified.

Because the BGAs 56 are disposed on the front face and rear face of the multi-layer printed wiring board 100 of the second embodiment, other printed wiring board can be connected to its both sides. For example, with an IC module 120 mounted through the BGA 56 on the front face, it can be connected to a printed wiring board through the BGA 56 on the rear face. Further, freedom of the shape of an IC module to be mounted is intensified.

According to the second embodiment, the BGA 56 of the rear face is disposed just below the BGA 56 and the pad 36p of the front face such that it does not overlap. That is, as shown in FIG. 18, the center line X1 of the via hole 18 on which the BGA 56 is to be mounted is deflected from the center line X2 of the via hole 18 on which the BGA 56 is to be mounted. As a consequence, the same effect as the first embodiment can be obtained.

According to the second embodiment, the IC chip 122 is a memory having a small heat release value and the IC chip 70 is a logic IC having a large heat release value. The metallic layer 28a is provided just below this IC chip 70 and the metallic layer 58a is connected to the BGA 56 through the via hole 18a. With this structure, heat can be transmitted to a printed wiring board connected to the BGA 56 efficiently to radiate the heat.

The multi-layer printed wiring board according to modification of the second embodiment can be constructed like the modifications of the first embodiment described with reference to FIGS. 11, 12.

Because the manufacturing method of the multi-layer printed wiring board according to the second embodiment of the present invention is the same as the first embodiment, description thereof is omitted. In the meantime, as modifications 1, 2 of the manufacturing method of the second embodiment, the same configuration as the modification 1 (FIG. 11) and modification 2 (FIG. 12) of the manufacturing method of the first embodiment can be adopted.

Third Embodiment

Figure 21:
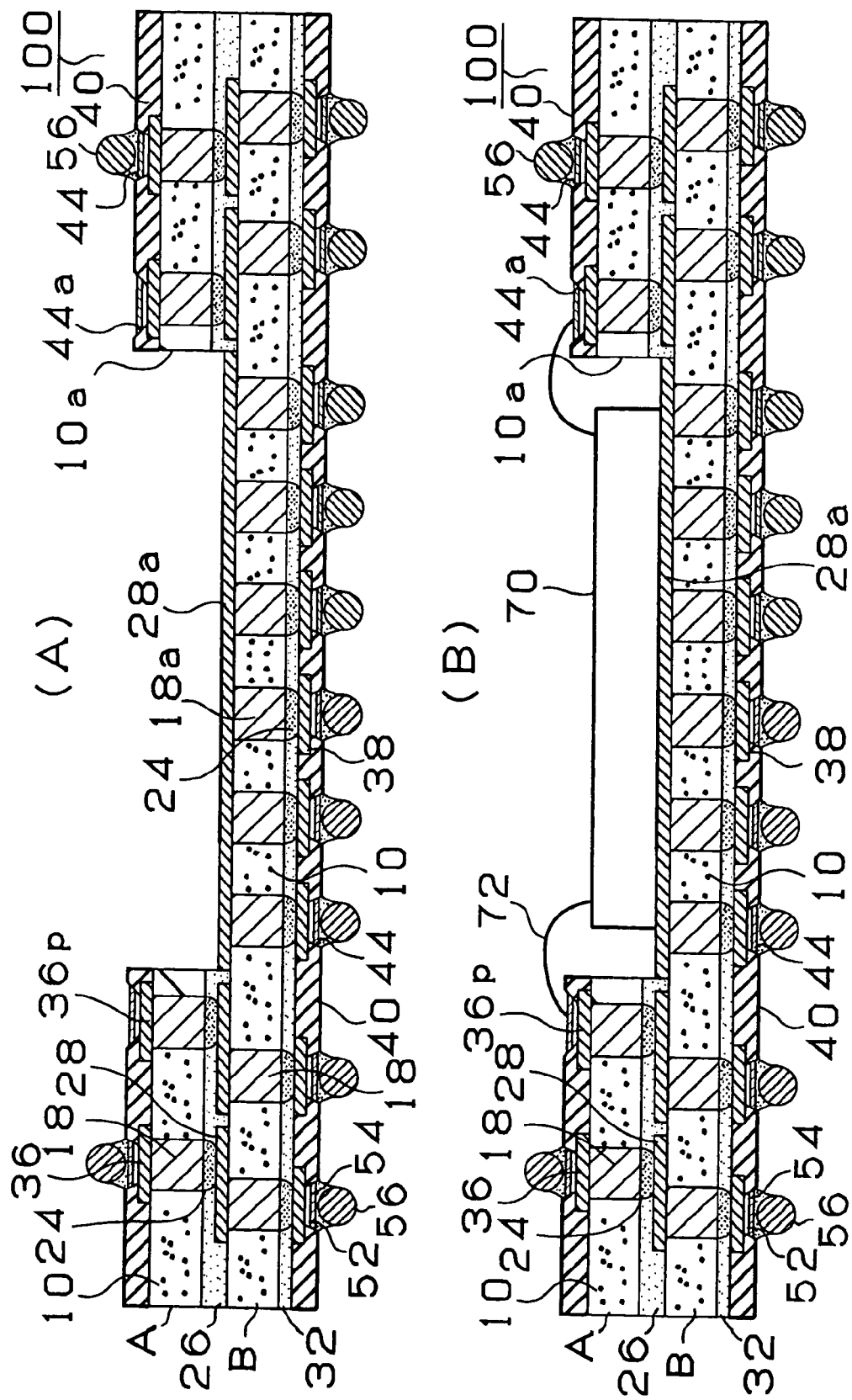
FIG. 21(A) is a sectional view of the multi-layer printed wiring board according to a third embodiment and FIG. 21(B) is a sectional view showing a condition in which the IC chip is loaded on the multi-layer printed wiring board.

Subsequently, a multi-layer printed wiring board according to the third embodiment of the present invention will be described with reference to FIGS. 21, 22.

FIG. 21(A) shows a section of the multi-layer printed wiring board according to the third embodiment and FIG. 21(B) shows a condition in which an IC chip is mounted on the multi-layer printed wiring board. FIG. 22(A) is a plan view of the multi-layer printed wiring board of FIG. 21(A) and FIG. 22(B) is a plan view of the multi-layer printed wiring board of FIG. 21(B).

According to the second embodiment described with reference to FIGS. 17, 19, the bonding pad 36p is formed rectangular and the via hole 18 is connected to an end of the bonding pad 36p while wire 72 is bonded to the other end, according to the third embodiment, a circular bonding pad 36p is disposed just above the via hole 18 and the wire 72 is bonded.

Because the multi-layer printed wiring board according to the third embodiment, the bonding pad 36p is disposed just above the via hole 18 composed of conductive material filled in a non-through hole, a necessity of disposing around the bonding pads is eliminated and consequently, wiring density can be raised. Although according to the third embodiment, the bonding pad is formed circularly, this shape may be elliptic, oval, polygonal and of other shape.

Example 2

Because the manufacturing method of the example 2 is the same as the above-described example 1, description thereof is omitted.

[Modification 1 of Example 2]

Although the mulit-layer printed wiring board according to the modification 1 of the example 2 had the same structure as the example 2 (the via holes 18 are deflected between the upper and lower single side circuit boards and the BGA 56 is deflected from just below), the conductive bump is formed of Sn/Zn (97:3).

[Modification 2 of Example 2]

Although the multi-layer printed wiring board of the modification 2 of the example 2 had the same structure as the above-described example 2, the conductive bump was formed of Sn/Sb (95:5).

[Modification 3 of Example 2]

Although the multi-layer printed wiring board of the modification 3 of the example 2 had the same structure as the above-described example 2, the conductive bump was formed of Sn/Pb (97:3).

[Modification 4 of Example 2]

Although the multi-layer printed wiring board of the modification 4 of the example 2 had the same structure as the above-described example 2, the conductive bump was formed of Sn/Ag (95:5).

[Change 1 of Example 2]

In the multi-layer printed wiring board of the change 1 of the example 2, the conductive bump was formed of Sn/Su (97:3). However, different from the structure of the example 2, as shown in FIG. 14(A), the external terminal 56 was disposed on the rear face just below the external terminal 56 on the front face.

[Change 2 of Example 2]

The multi-layer printed wiring board of the change 1 of the example 2 was formed of Sn/Su (97:3). However, different from the structure of the example 2, as shown in FIG. 14(B), the via hole 18 in the upper single side circuit board was disposed just above the via hole 18 in the lower single side circuit board.

[Change 3 of Example 2]

In the multi-layer printed wiring board of the change 1 of the example 2, the conductive bump was formed of Sn/Su (97:3). However, different from the structure of the example 2, as shown in FIG. 14(C), the external terminal 56 on the rear face was disposed just below the external terminal 56 on the front face and the via hole 18 in the upper single side circuit board was disposed just above the via hole 18 in the lower single side circuit board.

Comparative Example 3

As shown in FIG. 15(A), a multi-layer printed wiring board was constructed with a single side circuit board according to the manufacturing method described in Japanese Patent Application Laid-Open No. HEI10-13028. FIG. 15(B) shows a condition in which the multi-layer printed wiring board shown in FIG. 15(A) is mounted on the DOTA board 90. FIG. 15(C) shows a condition in which the IC chips 70A, 70B are stacked. Here, the via holes 118 were constructed by filling the non-through holes with conductive paste and the single side circuit boards were overlaid without using any conductive bump. The via holes 118 were disposed such that they are stacked. A land 136 was formed by extending a conductor circuit connected to the via hole and a wiring pad of the IC chip 70 was connected with the land 136 with wire 72.

Comparative Example 4

Although the multi-layer printed wiring board of the comparative example 4 had the same structure as the comparative example 3, the non-through holes were filled with plating instead of conductive paste.

[Comparison Test]

According to the example 2, a PKG substrate loaded with an IC chip was connected to the top face of the board and a multi-layer substrate produced according to subtractive method loaded with only electronic components such as capacitor was connected to the bottom face of the board.

According to the comparative examples 3, 4, an IC chip structured into multi-layer structure by stacking layers was loaded on the top face of the board and the side in which the BGA was disposed was connected to a multi-layer board (daughter board 90) produced according to the subtractive method loaded with only electronic components such as capacitor.

FIG. 23 shows an average value as a result of measuring inductance of five pieces produced in the example 1 and comparative examples 3, 4 in a simple manner. The measurement result is a simulation result. At the same time, it shows a result of conductivity test performed as reliability test (with three minutes at 135° C. to three minutes at −65° C. as a cycle under heat cycle condition, performed 500 cycles, 1000 cycles, 2000 cycles, 3000 cycles).

It was verified that the inductance could be reduced and electric characteristic and reliability were secured as compared with the conventional example (comparative example). Further, it was verified that an example in which Cu, Zn, Sb was mixed in its conductive bump had a higher reliability than other conductive metals. Further, it was verified that a structure not adopting the stacked structure (via holes are disposed just above the via holes) and in which the external terminal was deflected from just below the external terminal on an opposite face had more excellent electric connectivity and reliability.

In the structure of the comparative example having no conductive bump, its reliability drops because peeling of a bonding face occurs early.

According to the example, dead space can be reduced. Thus, as compared with the configuration of the comparative example, its size can be reduced by 5-10% even if an IC having the same clock number is installed.

The reason is that the dead space (area in which substantially wiring cannot be placed) in the vicinity of the wiring pad of the IC pad decreases.

Because according to the example 2, the wire is connected to the conductor circuit on the via hole in which the non-through hole is filled with conductive material, the dead space for wiring decreases thereby reducing the size of the configuration.

Further, improvement of electric characteristic, for example, reduction of inductance is achieved.

Additionally, reliability is improved because the conductive bump is used. If the via holes are not formed into the stacked structure or the external terminals are provided on both sides, the reliability can be improved by not providing the external terminal of an opposite face just below the external terminal.

The invention claimed is:

1. A multi-layer printed wiring board comprising:
 a first substrate having an opening and having a plurality of external terminals positioned to be connected to a package substrate;
 a second substrate laminated to the first substrate and having a plurality of external terminals positioned to be connected to a mother board, the second substrate having a continuous metallic layer portion in the opening of the first substrate and a plurality of non-through holes filled with conductive material and connected to the continuous metallic layer portion such that the non-through holes are electrically connected to each other; and
 an IC component having a terminal side including a plurality of terminals, and a non-terminal side which is opposite to the terminal side, the IC component being loaded in the opening of the first substrate such that the non-terminal side of the IC component contacts the metallic layer portion and the terminals of the IC component face outward of the opening in the first substrate,
 wherein the IC component is accommodated in the opening such that the metallic layer portion and non-through holes of the second substrate irradiate heat generated by the IC component.

2. The multi-layer printed wiring board according to claim 1, wherein the external terminals of the first substrate are disposed offset the external terminals of the second substrate.

3. The multi-layer printed wiring board according to claim 1, further comprising a plurality of conductive non-through holes provided in the first substrate and connected to the external terminals of the first substrate and a plurality of conductive non-through holes provided in the second substrate and connected to the external terminals of the second substrate, wherein the conductive non-through holes in the first substrate and the conductive non-through holes in the second substrate are positioned offset from each other.

4. The multi-layer printed wiring board according to claims 1, further comprising a plurality of bonding pads provided for wire bonding the IC component in the first substrate.

5. The multi-layer printed wiring board according to claim 1, wherein the external terminals of the first substrate are positioned in a peripheral form surrounding the IC component, and the external terminals of the second substrate are positioned in a grid form.

6. The multi-layer printed wiring board according to claim 1, wherein the IC component has a bottom portion of which an entire surface of the bottom portion of the IC component is loaded over the metallic layer portion in the second substrate.

7. The multi-layer printed wiring board according to claim 1, wherein the first substrate has a plurality of terminals positioned to be connected to the plurality of terminals of the IC component, and the external terminals and terminals in the first substrate are positioned to face the opposite side of the metallic layer portion of the second substrate.

8. The multi-layer printed wiring board according to claim 3, wherein the conductive non-through holes in the first and second substrates are provided with a plurality of conductive bumps, respectively.

9. The multi-layer printed wiring board according to claim 4, wherein the plurality of bonding pads are connected to a plurality of conductive non-through holes formed underneath the plurality of bonding pads, respectively.

10. The multi-layer printed wiring board according to claim 4, wherein the bonding pads have a rectangular shape.

11. The multi-layer printed wiring board according to claim 9, wherein the plurality of conductive non-through holes formed underneath the plurality of bonding pads, respectively, has a plurality of conductive bumps, respectively, on an opposite face of the bonding pads.

* * * * *